(12) United States Patent
Takahashi et al.

(10) Patent No.: US 11,296,135 B2
(45) Date of Patent: Apr. 5, 2022

(54) FILTER, OPTICAL SENSOR, SOLID-STATE IMAGING ELEMENT, AND IMAGE DISPLAY DEVICE

(71) Applicant: FUJIFILM Corporation, Tokyo (JP)

(72) Inventors: Kazutaka Takahashi, Haibara-gun (JP); Kazuya Oota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 61 days.

(21) Appl. No.: 16/545,276

(22) Filed: Aug. 20, 2019

(65) Prior Publication Data

US 2019/0378868 A1 Dec. 12, 2019

Related U.S. Application Data

(63) Continuation of application No. PCT/JP2018/007971, filed on Mar. 2, 2018.

(30) Foreign Application Priority Data

Mar. 7, 2017 (JP) .............................. JP2017-042466

(51) Int. Cl.
*H01L 27/146* (2006.01)
*H01L 33/50* (2010.01)

(52) U.S. Cl.
CPC .. *H01L 27/14621* (2013.01); *H01L 27/14643* (2013.01); *H01L 33/504* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2012/0312990 A1 | 12/2012 | Aswell et al. | |
| 2013/0072615 A1 | 3/2013 | Muro et al. | |
| 2015/0372037 A1 | 12/2015 | Tomeba | |
| 2016/0099272 A1* | 4/2016 | Wang | H01L 27/14621 257/435 |
| 2017/0090083 A1 | 3/2017 | Takishita et al. | |
| 2017/0137444 A1* | 5/2017 | Sasaki | C07F 5/027 |

(Continued)

FOREIGN PATENT DOCUMENTS

| | | |
|---|---|---|
| CN | 102393215 A | 1/2013 |
| CN | 105190374 A | 12/2015 |

(Continued)

OTHER PUBLICATIONS

Japanese Office Acton, dated Mar. 10, 2020, for corresponding Japanese Application No. 2019-504538, with an English translation.

(Continued)

*Primary Examiner* — Xiaoming Liu
(74) *Attorney, Agent, or Firm* — Birch, Stewart, Kolasch & Birch, LLP

(57) ABSTRACT

Provided are a filter capable of detecting light with less noise, an optical sensor, a solid-state imaging element, and an image display device. This filter is provided with a plurality of different pixels that are two-dimensionally arranged, and at least one of the plurality of pixels is a pixel 11 of a near-infrared cut filter that shields at least a part of light having a wavelength in the near-infrared region and transmits light having a wavelength in the visible region.

16 Claims, 5 Drawing Sheets

(56) References Cited

U.S. PATENT DOCUMENTS

2017/0317132 A1 11/2017 Hatakeyama et al.
2019/0297278 A1* 9/2019 Sumi .................. H04N 5/332

FOREIGN PATENT DOCUMENTS

| CN | 105789227 A | 7/2016 |
|----|-------------|--------|
| JP | 2008-91535 A | 4/2008 |
| JP | 2012-122045 A | 6/2012 |
| JP | 2015-200878 A | 11/2015 |
| TW | 201600892 A | 1/2016 |
| WO | WO 2014/142259 A1 | 9/2014 |
| WO | WO 2016/031810 A1 | 3/2016 |
| WO | WO 2016/080003 A1 | 5/2016 |
| WO | WO 2016/117596 A1 | 7/2016 |

OTHER PUBLICATIONS

International Preliminary Report on Patentability and Written Opinion of the International Searching Authority (forms PCT/IB/373, PCT/ISA/237 and PCT/IB/326), dated Sep. 19, 2019, for corresponding International Application No. PCT/JP2018/007971, with a Written Opinion translation.

International Search Report (form PCT/ISA/210), dated May 29, 2018, for corresponding International Application No. PCT/JP2018/007971, with an English translation.

Chinese Office Action and Search Report for corresponding Chinese Application No. 201880013977.3, dated Dec. 25, 2020, with English translation of the Office Action.

Taiwanese Office Action and Search Report, dated Jun. 7, 2021, for corresponding Taiwanese Application No. 107107333, with an English translation of the Taiwanese Office Action.

* cited by examiner

FILTER, OPTICAL SENSOR, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2018/007971 filed on Mar. 2, 2018, which claims priority under 35 U.S.C § 119(a) to Japanese Patent Application No. 2017-042466 filed on Mar. 7, 2017. Each of the above application(s) is hereby expressly incorporated by reference, in its entirety, into the present application.

BACKGROUND OF THE INVENTION

1. Field of the Invention

The present invention relates to a filter, an optical sensor, a solid-state imaging element, and an image display device.

2. Description of the Related Art

In recent years, a charge coupled device (CCD) or a complementary metal-oxide semiconductor (CMOS) which is a solid-state imaging element for a color image has been used in digital cameras, mobile phones with a camera, and the like. A silicone photodiode having sensitivity to infrared rays has been used in a light-receiving unit of the solid-state imaging element. In this regard, a near-infrared cut filter is arranged on an optical path of a color filter to perform luminosity correction in some cases (see, for example, JP2015-200878A and WO2016/117596).

SUMMARY OF THE INVENTION

In recent years, attempts for performing various types of sensing using ambient light, infrared light, or the like have been studied. Attempts such as detection of an ambient brightness by detecting ambient light and adjustment of the quantity of light of a display, an illumination fixture, or the like have been made. It is preferable to detect a signal/noise ratio (S/N ratio) of desired in enhancement of a sensing accuracy of such various optical sensors.

Therefore, an object of the present invention is to provide a filter capable of detecting light with less noise, an optical sensor, a solid-state imaging element, and an image display device.

According to the studies conducted by the present inventors, it was found that the object can be accomplished by using pixels of a near-infrared cut filter, thereby leading to completion of the present invention. The present invention provides the following aspects.

<1> A filter comprising a plurality of different pixels two-dimensionally arranged therein,
in which at least one of the plurality of pixels is a pixel of a near-infrared cut filter that shields at least a part of light having a wavelength in the near-infrared region and transmits light having a wavelength in the visible region.

<2> The filter as described in <1>,
in which the pixel of the near-infrared cut filter has a maximum absorption wavelength in a wavelength range of 700 to 2,000 nm, and an absorbance Amax/absorbance A550 which is a ratio of the absorbance Amax at a maximum absorption wavelength to the absorbance A550 at a wavelength of 550 nm is 20 to 500.

<3> The filter as described in <1> or <2>,
in which the plurality of different pixels include a pixel of a first near-infrared cut filter and a pixel of a second near-infrared cut filter that shields light at a wavelength in the near-infrared region different from that of the first near-infrared cut filter.

<4> The filter as described in <3>,
in which a difference between the maximum absorption wavelength of the pixels of the first near-infrared cut filter and the maximum absorption wavelength of the pixels of the second near-infrared cut filter is 20 to 1,000 nm.

<5> The filter as described in any one of <1> to <4>,
in which the plurality of different pixels include a pixel other than that of the near-infrared cut filter.

<6> The filter as described in <5>,
in which the pixel other than that of the near-infrared cut filter is at least one selected from a transparent pixel, a colored pixel, and a pixel of a layer that selectively transmits or shields light at a specific wavelength.

<7> The filter as described in <6>,
in which the pixel of a layer that selectively transmits or shields light at a specific wavelength is at least one pixel selected from a pixel of an infrared transmitting filter or a pixel of an ultraviolet cut filter.

<8> The filter as described in any one of <1> to <6>,
in which the height difference between the top surfaces of the plurality of different pixels is 20% or less of the film thickness of the thickest pixel.

<9> The filter as described in <7>,
in which the height difference between the top surfaces of the plurality of different pixels is 10% or less of the film thickness of the thickest pixel.

<10> The filter as described in any one of <1> to <8>,
in which the filter has at least the pixel of the near-infrared cut filter and the pixel of the infrared transmitting filter, and a difference between the thicknesses of the both pixels is 20% or less of the film thickness of the thickest pixel.

<11> The filter as described in any one of <1> to <10>,
in which an average refractive index of light at a wavelength of 400 to 700 nm in the pixel of the near-infrared cut filter is 1.4 to 1.9.

<12> The filter as described in any one of <1> to <11>,
in which the near-infrared cut filter includes a near-infrared absorbing dye, and the near-infrared absorbing dye is a compound having a π-conjugated plane including a monocyclic or fused aromatic ring.

<13> The filter as described in <12>, in which the near-infrared absorbing dye is at least one selected from a pyrrolopyrrole compound, a cyanine compound, and a squarylium compound.

<14> The filter as described in <13>,
in which the near-infrared absorbing dye is a pyrrolopyrrole compound.

<15> An optical sensor comprising:
the filter as described in any one of <1> to <14>.

<16> A solid-state imaging element comprising:
the filter as described in any one of <1> to <14>.

<17> An image display device comprising:
the filter as described in any one of <1> to <14>.

According to the present invention, it is possible to provide a filter capable of detecting light with less noise, an optical sensor, a solid-state imaging element, and an image display device.

DESCRIPTION OF THE PREFERRED EMBODIMENTS

Figure 1:
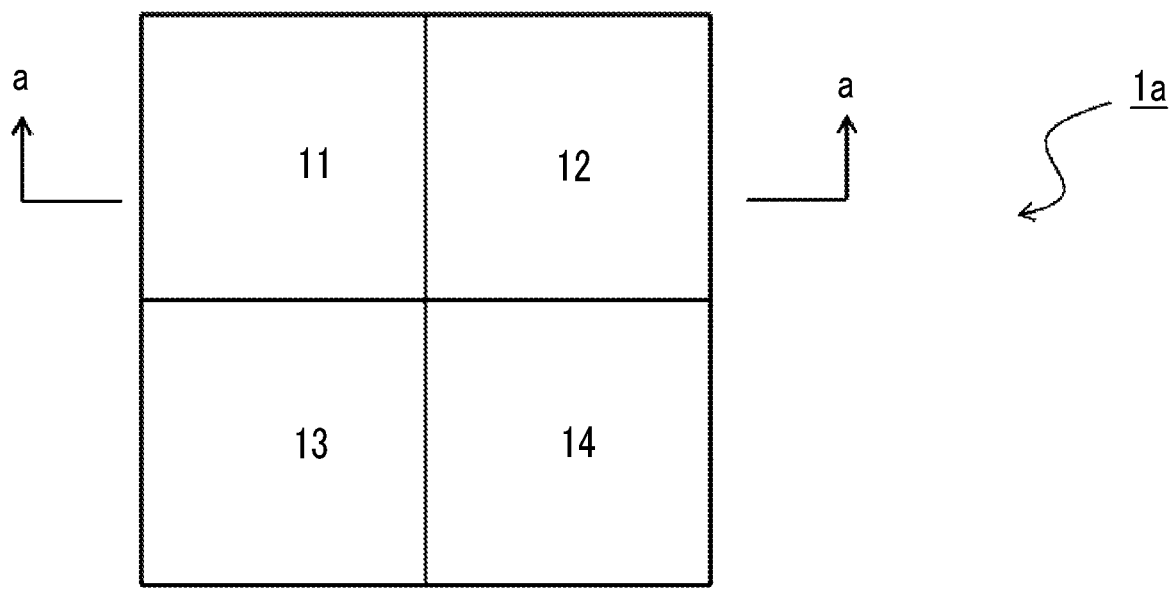
FIG. 1 is a schematic plan view of a filter of an embodiment of the present invention.

Hereinafter, the contents of the present invention will be described in detail.

In the present specification, a numerical range expressed using "to" means a range that includes the preceding and succeeding numerical values of "to" as the lower limit value and the upper limit value, respectively.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, and electron beams.

In the present specification, "(meth)allyl" represents either or both of allyl and methallyl, "(meth)acrylate" represents either or both of acrylate and methacrylate, "(meth)acryl" represents either or both of acryl and methacryl, and "(meth)acryloyl" represents either or both of acryloyl and methacryloyl.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm (inner diameter)×15.0 cm) as columns, and a 10-mmol/L lithium bromide N-methylpyrrolidinone (NMP) solution as an eluent.

In the present specification, near-infrared rays refer to light at a wavelength of 700 to 2,500 nm (electronic waves).

In the present specification, the total solid content refers to a total mass of the components excluding a solvent from all the components of a composition.

In the present specification, a term "step" not only means an independent step but also includes a step which is not clearly distinguished from other steps in a case where an intended action of the step is accomplished.

<Filter>

The filter of an embodiment of the present invention is a filter having a plurality of different pixels two-dimensionally arranged therein, in which at least one of the plurality of pixels is a pixel of a near-infrared cut filter that shields at least a part of light having a wavelength in the near-infrared region and transmits light having a wavelength in the visible region.

By incorporation of the near-infrared cut filter, the filter of the embodiment of the present invention can shield light at a wavelength in the near-infrared region included in diode light or the like due to the pixel of the near-infrared cut filter, and can detect desired light such as ambient light with less noise. Thus, by using the filter of the embodiment of the present invention in an optical sensor, it is possible to perform detection with a high signal/noise ratio (S/N ratio). For example, it is possible to detect a clear image with less noise or detect ambient light or the like having less noise with good sensitivity.

Furthermore, in the present invention, an expression that a plurality of different pixels are two-dimensionally arranged means that at least a part of the pixels are present on the same plane. In the filter of the embodiment of the present invention, the respective pixels are preferably formed on the same plane.

In the filter in the embodiment of the present invention, the pixel of the near-infrared cut filter may be a single layer film of a film capable of cutting near-infrared rays (hereinafter also referred to as a near-infrared cut layer), and may be a laminate of other layers in addition to the near-infrared cut layer within a range not impairing the spectral characteristics of the near-infrared cut layer. Incidentally, in the case where the pixel of the near-infrared cut filter is constituted by laminating two or more layers of film, it is necessary that at least a part of light at a wavelength in the infrared region is shielded in a state in which a plurality of films are laminated (a laminate state), and the near-infrared cut filter has a property of transmitting light at a wavelength in the visible region. Examples of the pixel of the near-infrared cut filter constituted by laminating two or more layers of films include a pixel constituted by laminating a near-infrared cut layer and a transparent layer. On the other hand, since a filter constituted by arranging a near-infrared cut layer and a colored layer on the same optical path has an absorption with respect to a wavelength in the visible region, such the pixel does not correspond to the pixel of the near-infrared cut filter in the embodiment in the present invention.

In the present invention, the pixel of the near-infrared cut filter preferably has a maximum absorption wavelength in a wavelength range of 700 to 2,000 nm, more preferably has a maximum absorption wavelength in a wavelength range of 700 to 1,300 nm, and still more preferably has a maximum absorption wavelength in a wavelength range of 700 to 1,000 nm. Further, the absorbance Amax/absorbance A550 which is a ratio of the absorbance Amax at a maximum absorption wavelength to the absorbance A550 at a wavelength of 550 nm is preferably 20 to 500, more preferably 50 to 500, still more preferably 70 to 450, and particularly preferably 100 to 400. According to this aspect, it is easy to detect ambient light having a high S/N ratio or the like.

The pixel of the near-infrared cut filter preferably satisfies at least one condition of the following (1) to (4), and more preferably satisfies any of (1) to (4).

(1) The transmittance at a wavelength of 400 nm is preferably 70% or more, more preferably 80% or more, still more preferably 85% or more, and particularly preferably 90% or more.

(2) The transmittance at a wavelength of 500 nm is preferably 70% or more, more preferably 80% or more, still more preferably 90% or more, and particularly preferably 95% or more.

(3) The transmittance at a wavelength of 600 nm is preferably 70% or more, more preferably 80% or more, still more preferably 90% or more, and particularly preferably 95% or more.

(4) The transmittance at a wavelength of 650 nm is preferably 70% or more, more preferably 80% or more, still more preferably 90% or more, and particularly preferably 95% or more.

The transmittance of the pixel of the near-infrared cut filter in any of the wavelength range of 400 to 650 nm is preferably 70% or more, more preferably 80% or more, and still more preferably 90% or more. In addition, the transmittance at least one point in a wavelength range of 700 to 2,000 nm is preferably 20% or less.

The average refractive index of the light at a wavelength of 400 to 700 nm in the pixel of the near-infrared cut filter is preferably 1.4 to 1.9. The upper limit is preferably 1.8 or less, and more preferably 1.7 or less. The lower limit is preferably 1.5 or more, and more preferably 1.6 or more. In a case where the average refractive index of the pixels of the near-infrared cut filter is within the range, it is possible to increase the light-collecting ratio of desired light. In particular, in a case where the filter of the embodiment of the present invention has pixels of a near-infrared cut filter and pixels of an infrared transmitting filter, it is possible to increase the light-collecting properties of the light transmitting the pixels of the infrared transmitting filter, and thus, effectively suppress a crosstalk.

As the filter of the embodiment of the present invention, any of filters having a plurality of different pixels two-dimensionally arranged therein, in which at least one of the plurality of pixels is constituted with pixels of a near-infrared cut filter. For example, examples of the filter of the embodiment of the present invention include an aspect of a filter including a pixel of a first near-infrared cut filter and a pixel of a second near-infrared cut filter that shields light at a wavelength in the near-infrared region different from that of the first near-infrared cut filter (first aspect), and an aspect of a filter further including pixels other than the pixels of the near-infrared cut filter, in addition to the pixels of the near-infrared cut filter (second aspect). In the first aspect, the filter of the embodiment of the present invention may be constituted with only the pixels of the near-infrared cut filter or may also further include a pixel other than that of the near-infrared cut filter. According to the first aspect, the filter includes two or more kinds of pixels of the near-infrared cut filter, and thus, light with further reduced noise is likely to be detected. In addition, for example, in a case where near-infrared light sources at different wavelengths are used, lights each having different wavelengths can also be simultaneously detected from the respective pixels of the near-infrared cut filter. In addition, according to the second aspect, the filter further includes other pixels, in addition to the pixel of the near-infrared cut filter, and thus, it is possible to provide a filter capable of simultaneously detecting a plurality of different lights.

In the first aspect, the pixels of the second near-infrared cut filter may be of only one kind or of two or more kinds. That is, the filter of the embodiment of the present invention may include two or more kinds of the pixels of the near-infrared cut filter that shield each different light at a wavelength in the infrared region.

In the first aspect, a difference between the maximum absorption wavelength of the pixel of the first near-infrared cut filter and the maximum absorption wavelength of the pixel of the second near-infrared cut filter can be appropriately selected depending on applications. For example, the difference is preferably 20 to 1,000 nm. The upper limit is preferably 500 nm or less, and more preferably 200 nm or less. The lower limit is preferably 30 nm or more, and more preferably 40 nm or more.

In the first aspect, the ratios of the areas of the respective pixels of the near-infrared cut filters may be the same as or different from each other. For example, in a case where the ratios of the areas of the respective pixels of the near-infrared cut filter are the same as each other, it is hard to expect an effect of high resolution. Further, by increasing the ratio of the area of the pixel of the longer near-infrared cut filter at a maximum absorption wavelength, it is possible to expect effects such as high sensitivity and an enhanced S/N ratio.

In the first aspect, examples of a preferred combination of the pixels of the first near-infrared cut filter and the pixels of the second near-infrared cut filter include the following combinations.

(1) A combination of pixels of a near-infrared cut filter that shields light at a wavelength of 800 to 850 nm and pixels of a near-infrared cut filter that shields light at a wavelength of 900 to 950 nm.

(2) A combination of pixels of a near-infrared cut filter that shields light at a wavelength of 770 to 820 nm and pixels of a near-infrared cut filter that shields light at a wavelength of 900 to 950 nm.

(3) A combination of pixels of a near-infrared cut filter that shields light at a wavelength of 770 to 820 nm and pixels of a near-infrared cut filter that shields light at a wavelength of 800 to 850 nm.

(4) A combination of pixels of a near-infrared cut filter that shields light at a wavelength of 700 to 800 nm and pixels of a near-infrared cut filter that shields light at a wavelength of 800 to 850 nm.

(5) A combination of pixels of a near-infrared cut filter that shields light at a wavelength of 700 to 800 nm, pixels of a near-infrared cut filter that shields light at a wavelength of 800 to 850 nm, and pixels of a near-infrared cut filter that shields light at a wavelength of 900 to 950 nm.

Figure 5:
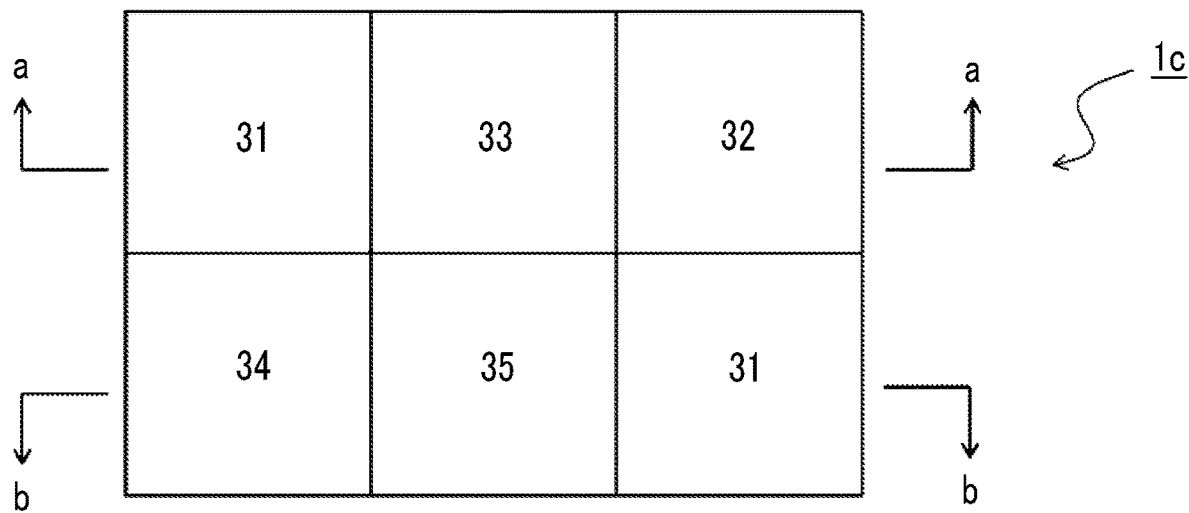
FIG. 5 is a schematic plan view of a filter of the embodiment of the present invention.
Figure 6:
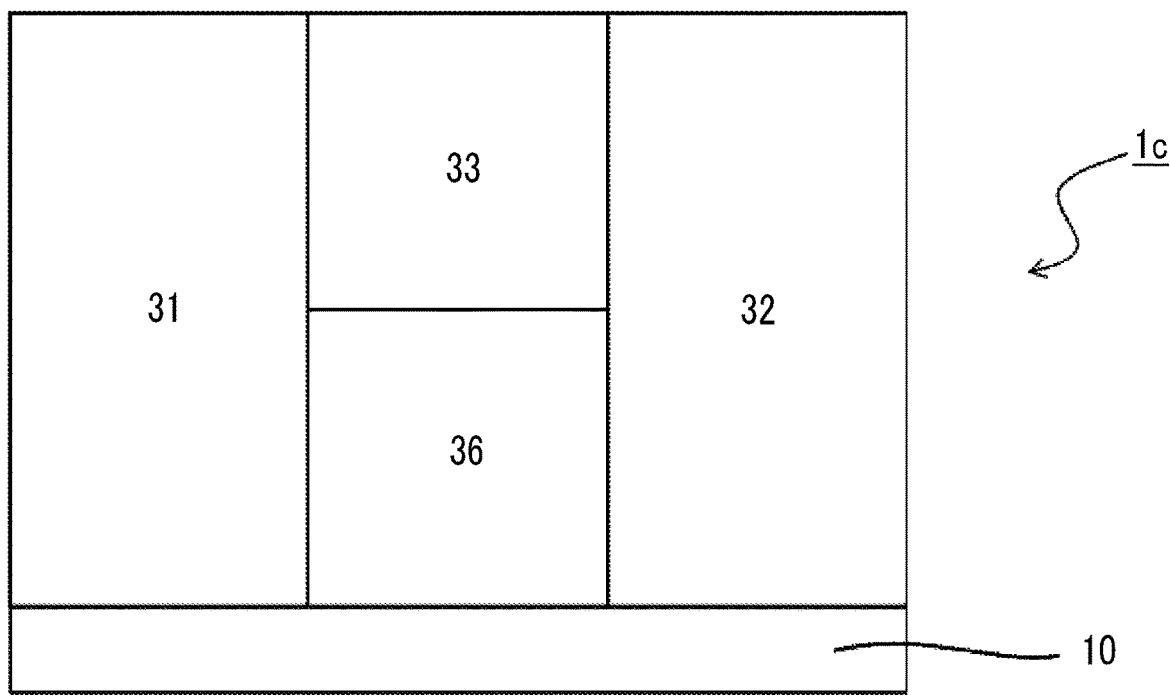
FIG. 6 is a a-a cross-sectional view of FIG. 5.
Figure 7:
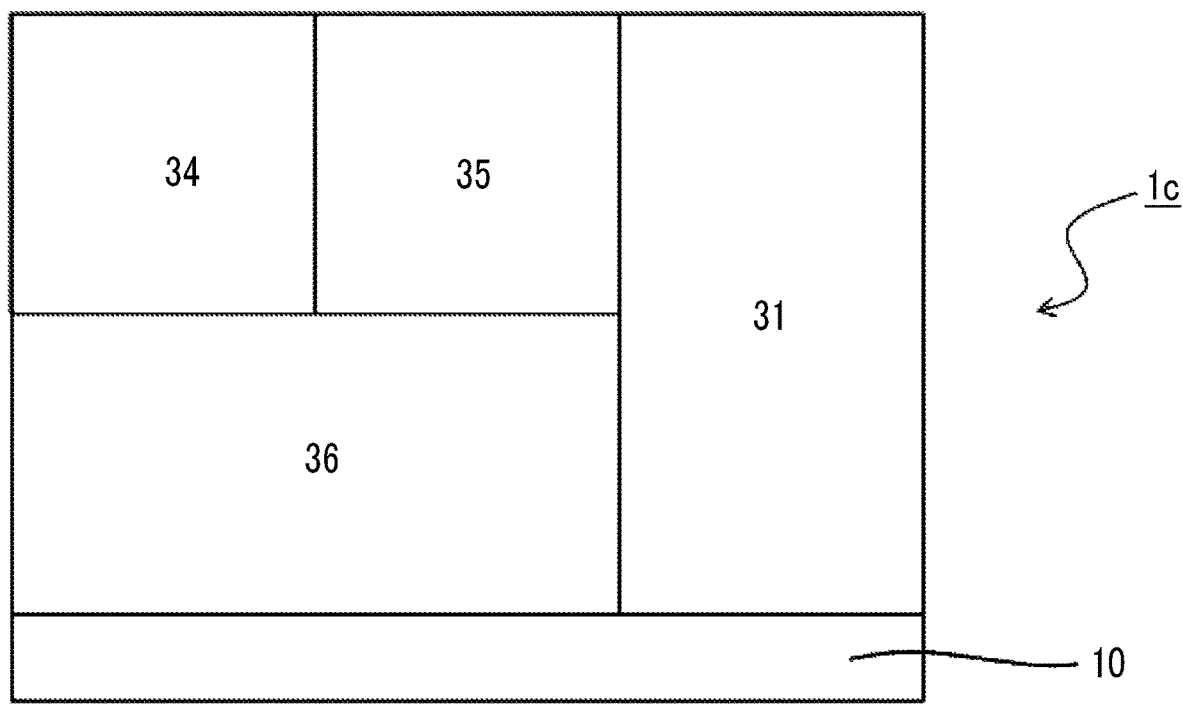
FIG. 7 is a b-b cross-sectional view of FIG. 5.

Examples of pixels other than those of a near-infrared cut filter, which can be used in the filter of the embodiment of the present invention (also referred to as other pixels), include transparent pixels, colored pixels, and pixels of a layer that selectively transmits or shields light at a specific wavelength. Examples of the pixels of a layer that selectively transmits or shields light at a specific wavelength include pixels of an infrared transmitting filter and pixels of an ultraviolet cut filter. As such pixels, pixels can be appropriately selected depending on the applications. For example, in a case where the pixels of the infrared transmitting filter are used as such others pixel, it is possible to provide a filter capable of detecting infrared light and ambient light. Further, the transparent pixels as such other pixels are pixels formed of a single layer film of a transparent layer. Such other pixels other than the transparent pixels may be in a single film or a laminate of two or more layers of films. For example, as shown in FIGS. 5 to 7 which will be described later, colored pixels are formed of a laminate of a colored layer and a near-infrared cut layer. Further, the pixels of the infrared transmitting filter may also be formed of a laminate of an infrared transmitting layer and a transparent layer. Further, in the present invention, the pixels of the infrared transmitting filter mean pixels that shield at least a part of visible light and transmit at least a part of near-infrared rays. In a case where the pixels of the infrared transmitting filter are constituted with a laminate of films of two or more layers (multi-layered film), the pixels only need to have the above-mentioned spectral characteristics as a multi-layered film, or the film of one layer itself may not have the above-mentioned spectral characteristics. In addition, the pixels of the ultraviolet cut filter mean pixels that shield at least a part of ultraviolet rays. The pixel of the ultraviolet cut filter may be one that transmits or shields visible light and/or near-infrared rays.

It is preferable that the pixel of the infrared transmitting filter satisfies spectral characteristics that the maximum value of a transmittance in a wavelength range of 400 to 640 nm is 20% or less and the minimum value of a transmittance in a wavelength range of 1,100 to 1,300 nm is 70% or more. The maximum value of a transmittance in a wavelength range of 400 to 640 nm is more preferably 15% or less, and still more preferably 10% or less. The minimum value of a transmittance in a wavelength range of 1,100 to 1,300 nm is more preferably 75% or more, and still more preferably 80% or more.

It is more preferable that the pixel of the infrared transmitting filter satisfies spectral characteristics of any one of the following (1) to (4).

(1): An aspect in which the maximum value of transmittances in a wavelength range of 400 to 640 nm is 20% or less (preferably 15% or less, and more preferably 10% or less) and the minimum value of transmittances in a wavelength range of 800 to 1,300 nm is 70% or more (preferably 75% or more, and more preferably 80% or more). According to this aspect, it is possible to provide a pixel that is capable of shielding light in a wavelength range of 400 to 640 nm and transmitting infrared light at a wavelength of more than 670 nm.

(2): An aspect in which the maximum value of transmittances in a wavelength range of 400 to 750 nm is 20% or less (preferably 15% or less, and more preferably 10% or less) and the minimum value of transmittances in a wavelength range of 900 to 1,300 nm is 70% or more (preferably 75% or more, and more preferably 80% or more). According to this aspect, it is possible to provide a pixel that is capable of shielding light in a wavelength range of 400 to 750 nm and transmitting infrared light at a wavelength of more than 850 nm.

(3): An aspect in which the maximum value of transmittances in a wavelength range of 400 to 830 nm is 20% or less (preferably 15% or less, and more preferably 10% or less) and the minimum value of transmittances in a wavelength range of 1,000 to 1,300 nm is 70% or more (preferably 75% or more, and more preferably 80% or more). According to this aspect, it is possible to provide a pixel that is capable of shielding light in a wavelength range of 400 to 830 nm and transmitting infrared light at a wavelength of more than 940 nm.

(4): An aspect in which the maximum value of transmittances in a wavelength range of 400 to 950 nm is 20% or less (preferably 15% or less, and more preferably 10% or less) and the minimum value of transmittances in a wavelength range of 1,100 to 1,300 nm is 70% or more (preferably 75% or more, and more preferably 80% or more). According to this aspect, it is possible to provide a pixel that is capable of shielding light in a wavelength range of 400 to 950 nm and transmitting infrared light at a wavelength of more than 1,040 nm.

In a case where the filter of the embodiment of the present invention includes a pixel of an infrared transmitting filter as another pixel, one kind or two or kinds of the pixels of the infrared transmitting filter may be included. For example, in a case where two or more kinds of the pixels of the infrared transmitting filter are included, it is possible to more effectively remove noise from desired light. In addition, it is possible to simultaneously detect infrared light at different wavelengths according to the respective pixels of the infrared transmitting filter. In a case where two or more kinds of the pixels of the infrared transmitting filter are used, it is preferable that one of the pixels of the infrared transmitting filter is a pixel of a filter that shields light at a longer wavelength than the wavelength of light of the pixel of the other infrared transmitting filter.

Examples of a combination of the pixels of two or more infrared transmitting filters include combinations of the following (A) to (C).

(A): A combination of a pixel of the infrared transmitting filter having spectral characteristics of (1) above and at least one pixel of the infrared transmitting filters having spectral characteristics of any one of (2) to (4) above.

(B): A combination of a pixel of the infrared transmitting filter having spectral characteristics of (2) above and at least one pixel of the infrared transmitting filters having spectral characteristics of (3) or (4) above.

(C): A combination of a pixel of the infrared transmitting filter having spectral characteristics of (3) above and a pixel of the infrared transmitting filters having spectral characteristics of (4) above.

With regard to the transparent pixel, the minimum value in the transmittances in a wavelength range of 400 to 600 nm is preferably 80% or more, more preferably 90% or more, and still more preferably 95% or more.

With regard to the pixel of the ultraviolet cut filter, the minimum value in the transmittances in a wavelength range of 400 to 700 nm is preferably 60% or more, more preferably 70% or more, and still more preferably 80% or more. In addition, the minimum value in the transmittances in a wavelength range of 300 to 400 nm is preferably 15% or less, more preferably 10% or less, and still more preferably 5% or less.

The colored pixel is preferably a pixel that exhibits a color selected from red, green, blue, yellow, cyan, and magenta. In a case where the filter of the embodiment of the present invention includes a colored pixel as another pixel, one kind or two or more kinds of the colored pixels may be included.

In the filter of the embodiment of the present invention, the height difference between the top surfaces of the plurality of different pixels is preferably 20% or less, more preferably 10% or less, and still more preferably 5% or less of the film thickness of the thickest pixel. In a case where the height difference between the top surfaces of the pixels is 20% or less of the film thickness of the thickest pixel, it is possible to reduce distortion of a microlens in the arrangement of the microlens on the top surface of each pixel, and it is possible to detect a clear image with less distortion, ambient light with less noise, or the like with good sensitivity. Further, it is possible to simplify a step for producing a filter, and reduce cost for producing the filter. In order to reduce the height difference between the top surfaces among the pixels, it is possible to use a method of adjusting a film thickness in formation of each pixel, a method of polishing and planarizing the top surface after formation of each pixel, and a method of adjusting the height among pixels by forming a transparent layer on a top surface and/or a bottom surface of the pixel. Incidentally, in a case where one pixel is constituted with a laminate of two or more layers of films, the film thickness of the laminate of two or more layers of films corresponds to a film thickness of the pixel. For example, in a case where the pixel of the near-infrared cut filter is constituted with a laminate of a near-infrared cut layer and a transparent layer, a total film thickness of the near-infrared cut layer and the transparent layer is a film thickness of the pixel of the near-infrared cut filter.

In a case where the filter of the embodiment of the present invention has at least a pixel of a near-infrared cut filter and a pixel of an infrared transmitting filter, a difference between the thicknesses of the both pixels is preferably 20% or less, more preferably 10% or less, and still more preferably 5% or less of the film thickness of the thickest pixel. Further, a height difference between the top surfaces of the pixel of the near-infrared cut filter and the pixel of the infrared transmitting filter is preferably 20% or less, more preferably 10% or less, and still more preferably 5% or less of the film thickness of the thickest pixel. In addition, for a reason that the pixel of the near-infrared cut filter and the pixel of the infrared transmitting filter can produce a filter small number of steps, each of the pixels is preferably a pixel of a single layer film.

In a case where the filter of the embodiment of the present invention has at least a pixel of a near-infrared cut filter and a pixel of the infrared transmitting filter, it is preferable that the pixel of the near-infrared cut filter and the pixel of the infrared transmitting filter are adjacent to each other from the viewpoint of resolution. Further, the ratios of the areas of the pixels of the both may be the same as each other; the ratio of the area of the pixel of the near-infrared cut filter may be larger than the ratio of the area of the pixel of the infrared transmitting filter; or the ratio of the area of the pixel of the near-infrared cut filter may be smaller than the ratio of the area of the pixel of the infrared transmitting filter. In a case where the ratios of the areas of both are the same as each other, it is possible to expect an effect of a high resolution. Further, in a case where the ratio of the area of the pixel of the near-infrared cut filter is larger than the ratio of the area of the pixel of the infrared transmitting filter, it is possible to expect an effect of improvement of an S/N ratio of signals of ambient light. In addition, in a case where the ratio of the area of the pixel of the near-infrared cut filter is smaller than the ratio of the area of the pixel of the infrared transmitting filter, it is possible to expect an effect of improvement of an S/N ratio of signals of infrared rays.

In the filter of the embodiment of the present invention, the thickness of the near-infrared cut layer in the pixel of the near-infrared cut filter is preferably 5 μm or less, more preferably 3 μm or less, still more preferably 2 μm or less, and particularly preferably 1 μm or less. The lower limit value is preferably 0.1 μm or more, more preferably 0.2 μm or more, and still more preferably 0.3 μm or more. Further, in a case where the thickness of the pixel of the near-infrared cut filter (in a case where the pixel of the near-infrared cut filter includes a laminate of a near-infrared cut layer and another layer such as a transparent layer, a total thickness of the near-infrared cut layer and such another layer) is preferably 5 μm or less, more preferably 3 μm or less, still more preferably 2 μm or less, and particularly preferably 1 μm or less. The lower limit value is preferably 0.1 μm or more, more preferably 0.2 μm or more, and still more preferably 0.3 μm or more.

Furthermore, in a case where the filter of the embodiment of the present invention has at least a pixel of a near-infrared cut filter and a pixel of an infrared transmitting filter, the thickness of the infrared transmitting layer in the pixel of the infrared transmitting layer filter is preferably 5 μm or less, more preferably 3 μm or less, still more preferably 2 μm or less, and particularly preferably 1 μm or less. The lower limit value is preferably 0.1 μm or more, more preferably 0.2 μm or more, and still more preferably 0.3 μm or more. Further, the thickness of the pixel of the infrared transmitting filter (in a case where the pixel of the infrared transmitting filter includes a laminate of an infrared transmitting layer and another layer such as a transparent layer, a total thickness of the infrared transmitting layer and such another layer) is preferably 5 μm or less, more preferably 3 μm or less, still more preferably 2 μm or less, and particularly preferably 1 μm or less. The lower limit value is preferably 0.1 μm or more, more preferably 0.2 μm or more, and still more preferably 0.3 μm or more.

Figure 2:
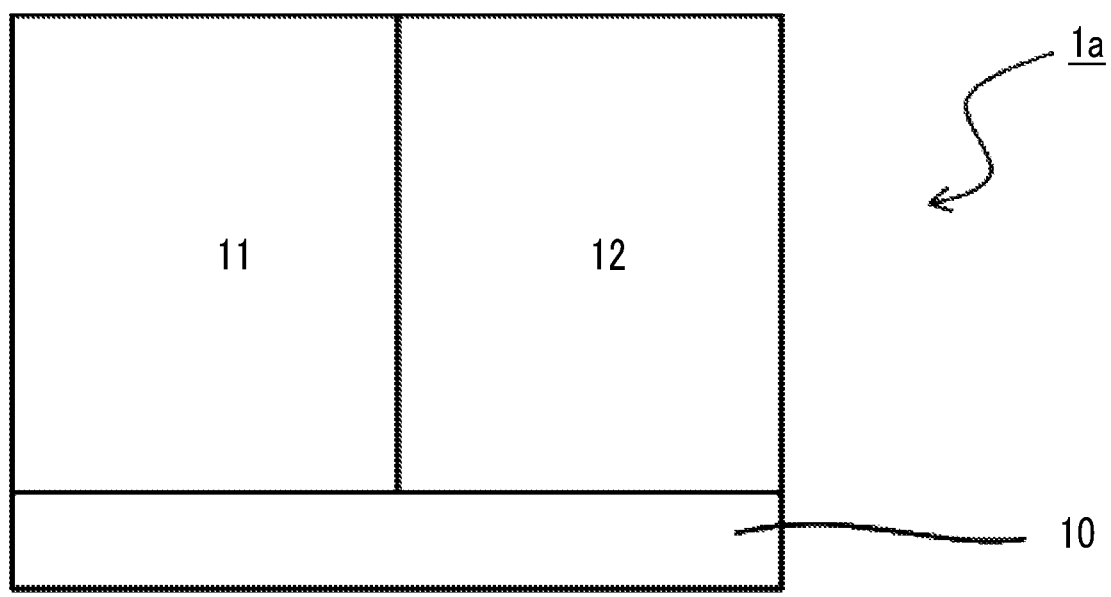
FIG. 2 is a a-a cross-sectional view of FIG. 1.

An embodiment of the filter of the embodiment of the present invention will be described with reference to drawings. FIGS. 1 and 2 are each a view showing an embodiment of the filter of the embodiment of the present invention, FIG. 1 is a planar view of a filter 1a viewed in the thickness direction, and FIG. 2 is a a-a cross-sectional view of FIG. 1. Reference 10 is a support, Reference 11 is the pixel of the near-infrared cut filter, and References 12 to 14 are each a pixel of a near-infrared cut filter or a pixel other than the near-infrared cut filter. Here, at least one of the pixels 12 to 14 is the pixel of the near-infrared cut filter that shields different light at a wavelength in the infrared region, which is different from the pixel 11, or a pixel other than the near-infrared cut filter. Examples of the pixel other than the near-infrared cut filter include the above-mentioned pixels. Further, in FIGS. 1 and 2, the pixel 11 is constituted with a single layer film of the near-infrared cut layer, but the pixel of the near-infrared cut filter 11 may be constituted with a laminate of the near-infrared cut layer and a transparent layer by providing the transparent layer on the top surface and/or the bottom surface of the near-infrared cut layer. However, for a reason of reducing the number of steps, the pixel of the near-infrared cut filter is preferably a single layer film of the near-infrared cut layer. Further, the pixel 12 is also constituted with a laminate of films of two or more layers. In addition, in FIGS. 1 and 2, each of the pixels is formed on the support 10, but an intermediate layer may be provided between the support and the pixel so as to increase the adhesiveness or the flatness.

Preferred examples of the filter shown in FIGS. 1 and 2 include the following aspects.

(1) An aspect in which at least one of the pixels 12 to 14 is a pixel of an infrared transmitting filter.

For example, an aspect in which the pixels 12 and 13 are each a pixel of an infrared transmitting filter and the pixel 14 is a pixel of a near-infrared cut filter, an aspect in which the pixels 12 to 14 are each a pixel of an infrared transmitting filter, an aspect in which the pixel 14 is a pixel of an infrared transmitting filter and the pixels 12 and 13 are each a pixel of a near-infrared cut filter, and the like. In a case where two or more pixels of a near-infrared cut filter are included, each of the pixels of the near-infrared cut filter may be the same as the pixel of the near-infrared cut filter, and may also be the pixel of the near-infrared cut filter that shields different light at a wavelength in the infrared region.

Furthermore, in a case where two or more pixels of the infrared transmitting filter are included, the respective pixels of the infrared transmitting filter may be the same pixels of the infrared transmitting filter or may also be pixels of the infrared transmitting filter that transmits light at a different wavelength.

(2) An aspect in which at least one of the pixels 12 to 14 is a colored pixel. For example, an aspect in which the pixels 12 and 13 are each a colored pixel and the pixel 14 is a pixel of a near-infrared cut filter, and an aspect in which the pixels 12 to 14 are each a colored pixel. The colored pixels in the pixels 12 to 14 may be either colored pixels having the same colors or colored pixels having different colors.

(3) An aspect in which at least one of the pixels 12 to 14 is a pixel of a near-infrared cut filter that shields different light at a wavelength in the infrared region from that of the pixel 11.

(4) An aspect in which at least one of the pixels 12 to 14 is a pixel of an ultraviolet cut filter.

(5) An aspect in which at least one of the pixels 12 to 14 is a transparent pixel.

Figure 3:
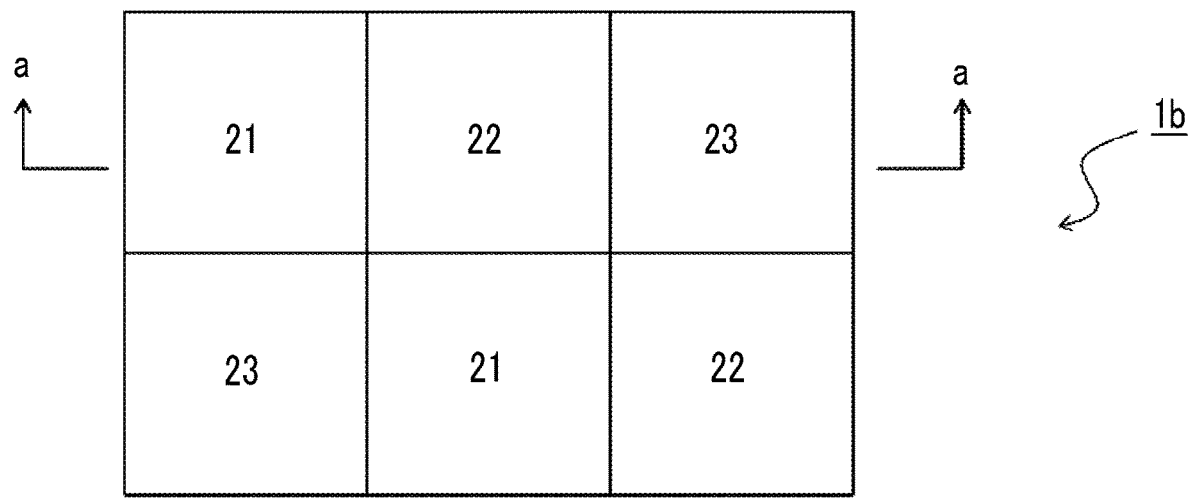
FIG. 3 is a schematic plan view of a filter of the embodiment of the present invention.
Figure 4:
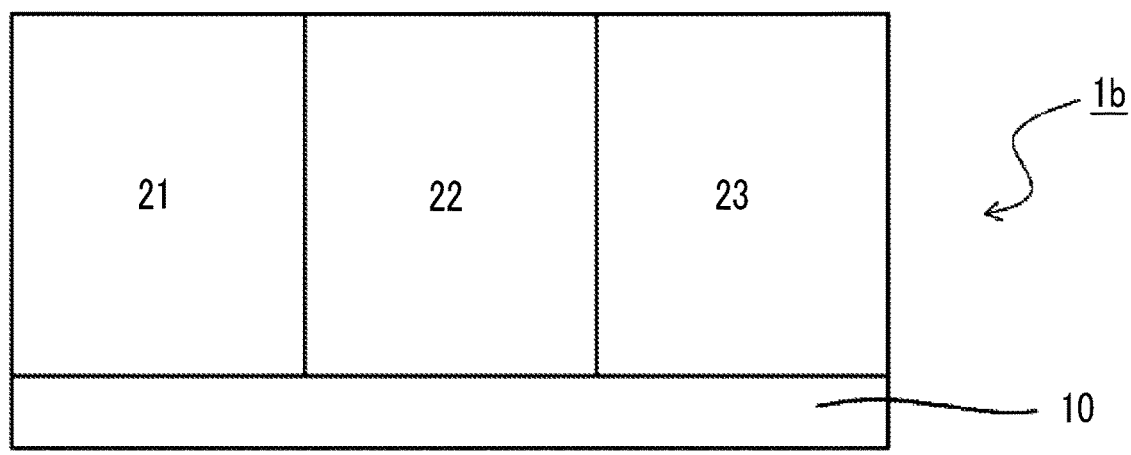
FIG. 4 is a a-a cross-sectional view of FIG. 3.

FIGS. 3 and 4 are each a view showing an embodiment of the filter of the embodiment of the present invention, FIG. 3 is a planar view of a filter 1b viewed in the thickness direction, and FIG. 4 is a a-a cross-sectional view of FIG. 3. Reference 10 is a support and References 21 to 23 are each a pixel of a near-infrared cut filter that shields different light at a wavelength in the infrared region. In FIGS. 3 and 4, the pixel of the near-infrared cut filter may be constituted with a laminate of the near-infrared cut layer and a transparent layer by providing the transparent layer on the top surface and/or the bottom surface of the near-infrared cut layer. In addition, in FIGS. 3 and 4, an intermediate layer may be provided between the support and the pixel so as to increase the adhesiveness or the flatness.

FIGS. 5 to 7 are each a view showing an embodiment of the filter of the embodiment of the present invention, FIG. 5 is a planar view of a filter 1c viewed in the thickness direction, FIG. 6 is a a-a cross-sectional view of FIG. 5, and FIG. 7 is a b-b cross-sectional view of FIG. 5. Reference 10 is a support, Reference 31 is a pixel of a near-infrared cut filter, Reference 32 is a pixel of a near-infrared cut filter that shields different light at a wavelength in the infrared region from that of the pixel 11, or a pixel of the infrared transmitting filter, References 33 to 35 are each a colored layer, and Reference 36 is a near-infrared cut layer. In FIGS. 5 to 7, a laminate of the colored layer 33 and the near-infrared cut layer 36, a laminate of the colored layer 34 and the near-infrared cut layer 36, and a laminate of the colored layer 35 and the near-infrared cut layer 36 are each the colored pixel in the embodiment of the present invention. An intermediate layer may be provided between the colored layer and the near-infrared cut layer so as to increase the adhesiveness or the flatness. In FIGS. 5 to 7, the pixel 31 of the near-infrared cut filter may be constituted with a laminate of the near-infrared cut layer and a transparent layer by providing the transparent layer on the top surface and/or the bottom surface of the near-infrared cut layer. Further, the pixel 32 of the infrared transmitting filter may be constituted with a laminate of the near-infrared transmitting layer and a transparent layer by providing the transparent layer on the top surface and/or the bottom surface of the near-infrared transmitting layer. In addition, in FIGS. 5 to 7, an intermediate layer may be provided between the support and the pixel so as to increase the adhesiveness or the flatness.

The filter of the embodiment of the present invention can be incorporated into various optical sensors such as a solid-state imaging element, an image display device (for example, a liquid crystal display device and an organic electroluminescence (organic EL) display device), and used. For example, an optical sensor having the filter of the embodiment of the present invention incorporated thereinto is not particularly limited, but can be preferably used in biometric applications, monitoring applications, mobile applications, automotive applications, agricultural applications, medical applications, distance measurement applications, gesture recognition applications, or the like.

The filter of the embodiment of the present invention can be produced using various compositions for forming pixels on a support. For example, the filter can be produced through a step of forming a composition layer by applying a composition for forming each pixel on a support and a step of forming a pattern of the composition layer. Examples of the pattern forming method include a pattern forming method using photolithography and a pattern forming method using a dry etching method. Hereinafter, each of the steps will be described.

<<Step of Forming Composition Layer>>

In the step of forming a composition layer, a composition layer is formed on a support, using each of the compositions for forming a pixel.

As the support, a substrate for a solid-state imaging element in which a solid-state imaging element (light-receiving element) such as a CCD and a CMOS is provided onto a substrate (for example, a silicon substrate) can be used. As a method for applying the composition onto the support, known methods can be used. Examples of the methods include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), a discharge system such as nozzle jet, flexographic printing, screen printing, gravure printing, reverse offset printing, and metal mask printing; a transfer method using a mold or the like; and a nanoimprint method. The application method using ink jet is not particularly limited and examples thereof include a method (in particular, pp. 115 to 133) described in "Extension of Use of Injector-Infinite Possibilities in Patent-" (February, 2005, S.B. Research Co., Ltd.) and the methods described in JP2003-262716A, JP2003-185831A, JP2003-261827A, JP2012-126830A, JP2006-169325A, or the like.

The composition layer formed on the support may be dried (pre-baked). The pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 3,000 seconds, more preferably 40 to 2,500 seconds, and still more preferably 80 to 220 seconds. Drying can be performed using a hot plate, an oven, or the like.

(Case of Forming Pattern by Photolithography)

The pattern forming method by photolithography preferably includes a step of patternwise exposing a composition layer (exposing step) and a step of removing the composition layer on the unexposed area to form a pattern (developing step). As desired, a step of baking the developed pattern (post-baking step) can be provided. Hereinafter, the respective steps will be described.

<<Exposing Step>>

The composition layer is patternwise exposed in the exposing step. For example, the composition layer can be subjected to patternwise exposure by performing exposure using an exposure device such as a stepper through a mask having a predetermined mask pattern. Thus, the exposed area can be cured. As the radiation (light) which can be used during the exposure, ultraviolet rays such as g-rays and i-rays are preferable, and the i-rays are more preferable. The irradiation dose (exposure dose) is, for example, preferably 0.03 to 2.5 J/cm², more preferably 0.05 to 1.0 J/cm², and most preferably 0.08 to 0.5 J/cm². The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m² to 100,000 W/m² (for example, 5,000 W/m², 15,000 W/m², or 35,000 W/m²). Appropriate conditions of each of the oxygen concentration and the illuminance of exposure energy may be combined, and for example, a combination of an oxygen concentration of 10% by volume and an illuminance of 10,000 W/m², a combination of an oxygen concentration of 35% by volume and an illuminance of 20,000 W/m², or the like is available.

<<Developing Step>>

Next, the composition layer on the unexposed area in the exposed composition layer is removed by development to form a pattern. The removal of the unexposed area by development can be performed using a developer. Thus, the composition layer of the unexposed area in the exposing step is eluted into the developer, and as a result, only a photo-cured portion remains. As the developer, an organic alkali developer causing no damage on the underlying solid-state imaging element, circuit, or the like is preferable. The temperature of the developer is preferably for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. As the alkali agent, a compound having a high molecular weight is preferable in consideration of the environments and the safety. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass. Moreover, a developer containing a surfactant may also be used. Examples of the surfactant include the surfactants described as the above-mentioned composition, with a non-ionic surfactant being preferable. The developer may first be prepared as a concentrated liquid and then diluted to a desired concentration upon use from the viewpoint of convenience in transportation and storage, but the concentration rate can be set to a range of 1.5- to 100-times. Incidentally, in a case where a developer including such an aqueous alkaline solution is used, it is preferable that cleaning (rinsing) with pure water is generally performed after development.

After the development, it is preferable that the film is dried and then heated (post-baking). Post-baking is a heating treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. The film after the development can be subjected to post-baking continuously or batchwise using a heating means such as a hot plate, a convection oven (hot air circulation dryer), and a high-frequency heater under the conditions. In addition, in a case where a pattern is formed through a low-temperature process, post-baking is not necessarily performed.

(Case of Forming Pattern by Dry Etching Method)

Pattern formation by a dry etching method can be carried out by a method, for example, including curing a composition layer to form a cured product layer, then forming a patterned photoresist layer on the obtained cured product layer, and then subjecting the cured product layer to dry-etching using an etching gas through a patterned photoresist layer as a mask. In the formation of a photoresist layer, it is preferable to further perform a pre-baking treatment. In particular, in an aspect in which a post-exposure heating treatment or a post-development heating treatment (post-baking treatment) is carried out a process for forming a photoresist is preferable. With regard to the pattern formation by a dry etching method, reference can be made to the description in paragraph Nos. 0010 to 0067 of JP2013-064993A, the contents of which are incorporated herein by reference.

<Composition for Forming Near-Infrared Cut Filter Layer>

Next, a composition for forming a near-infrared cut layer, which can be used in formation of a near-infrared cut layer, will be described. It is preferable that the composition for forming a near-infrared cut layer includes a near-infrared screening agent. The near-infrared screening agent may be either a material that absorbs near-infrared rays or a material that reflects near-infrared rays. As the material that absorbs near-infrared rays, a compound that absorbs light at any wavelength in a wavelength range of 700 to 2,000 nm is preferable, and a compound that has a maximum absorption wavelength in a wavelength range of 700 to 2,000 nm is more preferable.

In the present invention, as the near-infrared screening agent, a near-infrared absorbing dye is preferable. Further, as the near-infrared absorbing dye, a compound having a π-conjugated plane including a monocyclic or fused aromatic ring is preferable. The near-infrared absorbing dye may be either a pigment or a dye.

The number of atoms other than hydrogen constituting a π-conjugated plane contained in the near-infrared absorbing dye is preferably 14 or more, more preferably 20 or more, still more preferably 25 or more, and particularly preferably 30 or more. The upper limit is, for example, preferably 80 or less, and more preferably 50 or less.

The π-conjugated plane contained in the near-infrared absorbing dye preferably includes two or more monocyclic or fused aromatic rings, more preferably includes three or more monocyclic or fused aromatic rings, still more preferably includes four or more monocyclic or fused aromatic rings, and particularly preferably includes five or more monocyclic or fused aromatic rings. The upper limit is preferably 100 or less, more preferably 50 or less, and still more preferably 30 or less. Examples of the above-mentioned aromatic ring include a benzene ring, a naphthalene ring, a pentalene ring, an indene ring, an azulene ring, a heptalene ring, an indacene ring, a perylene ring, a pentacene ring, a quarterylene group, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, an a quinoxaline ring, an a pyrimidine ring, an a quinazoline ring, a pyridazine ring, a triazine ring, a pyrrole ring, an indole ring, an isoindole ring, a carbazole ring, and a fused ring having such the ring.

The near-infrared absorbing dye preferably has a maximum absorption wavelength in a wavelength range of 700 to 2,000 nm, more preferably has a maximum absorption wavelength in a wavelength range of 700 to 1,300 nm, and still more preferably has a maximum absorption wavelength in a wavelength range of 700 to 1,000 nm. Further, the absorbance Amax/absorbance A550 which is a ratio of the absorbance Amax at a maximum absorption wavelength to the absorbance A550 at a wavelength of 550 nm is preferably 20 to 500, more preferably 50 to 500, still more preferably 70 to 450, and particularly preferably 100 to 400. According to this aspect, a near-infrared cut layer having excellent visible transparency and near-infrared shielding properties is likely to be produced.

For the composition for forming a near-infrared cut layer, it is also preferable to use at least two kinds of compounds having different maximum absorption wavelengths as the near-infrared absorbing dye. According to this aspect, the waveform of the absorption spectrum of the film is spread as compared with a case of using one kind of the near-infrared absorbing dye, and thus, near-infrared rays in a wide wavelength range can be shielded. In a case of using two kinds of the near-infrared absorbing dyes, it is preferable that the composition includes at least a first near-infrared absorbing dye having a maximum absorption wavelength in a wavelength range of 700 to 2,000 nm, and a second near-infrared absorbing dye that has a shorter maximum absorption wavelength than that of the first near-infrared absorbing dye and has a maximum absorption wavelength in a wavelength range of 700 to 2,000 nm, and a difference between the maximum absorption wavelength of the first near-infrared absorbing dye and the maximum absorption wavelength of the second near-infrared absorbing dye is 1 to 150 nm.

In the present invention, as the near-infrared absorbing dye, at least one compound selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable; at least one compound selected from a pyrrolopyrrole compound, a cyanine compound, a squarylium compound, a phthalocyanine compound, a naphthalocyanine compound, or a diimmonium compound is more preferable; at least one selected from a pyrrolopyrrole compound, a cyanine compound, or a squarylium compound is more preferable; and a pyrrolopyrrole compound is particularly preferable. Examples of the diimmonium compound include the compounds described in JP2008-528706A, the contents of which are incorporated herein by reference. Examples of the phthalocyanine compound include the compounds described in paragraph No. 0093 of JP2012-077153A, the oxytitanium phthalocyanine described in JP2006-343631A, and the compounds described in paragraph Nos. 0013 to 0029 of JP2013-195480A, the contents of which are incorporated herein by reference. Examples of the naphthalocyanine compound include the compounds described in paragraph No. 0093 of JP2012-077153A, the contents of which are incorporated herein by reference. Further, as the cyanine compound, the phthalocyanine compound, the naphthalocyanine compound, the diimmonium compound, and the squarylium compound, the compounds described in paragraph Nos. 0010 to 0081 of JP2010-111750A, the contents of which are incorporated herein by reference, may be used. Incidentally, with reference to the cyanine compound, reference can be made to, for example, "Functional Colorants, edited by Makoto Okawara/Masaru Matsuoka/Teijiro Kitao/Tsuneoka Hirashima, published by Kodansha Scientific Ltd.", the contents of which are incorporated herein by reference. In addition, as the near-infrared absorbing compound, the compounds described in JP2016-146619A can also be used, the contents of which are incorporated herein by reference. In addition, as the phthalocyanine compound, a compound having the following structure can also be used.

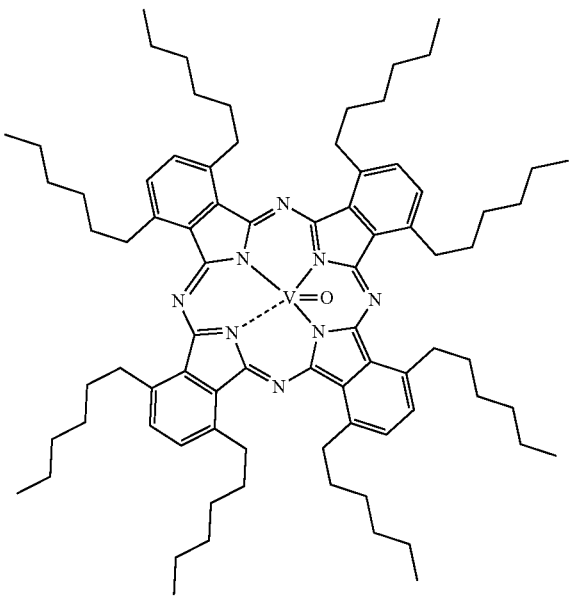

As the pyrrolopyrrole compound, a compound represented by Formula (PP) is preferable.

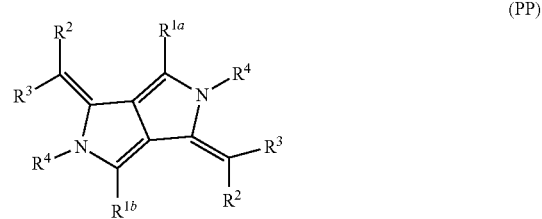

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may be bonded to at least one selected from $R^{1a}$, $R^{1b}$, or $R^3$ through a covalent bond or a coordination bond, and $R^{4A}$ and $R^{4B}$ each independently represent a substituent. With reference to the details of Formula (PP), reference can be made to the description in paragraph Nos. 0017 to 0047 of JP2009-263614A, paragraph Nos. 0011 to 0036 of JP2011-068731A, and paragraph Nos. 0010 to 0024 of WO2015/166873A, the contents of which are incorporated herein by reference.

$R^{1a}$ and $R^{1b}$ are each independently preferably an aryl group or a heteroaryl group, and more preferably an aryl group. Further, the alkyl group, the aryl group, and the heteroaryl group, represented by each of $R^{1a}$ and $R^{1b}$, may have a substituent or may be unsubstituted. Examples of the substituent include an alkoxy group, a hydroxy group, a halogen atom, a cyano group, a nitro group, —$OCOR^{11}$, —$SOR^{12}$, and —$SO_2R^{13}$. $R^{11}$ to $R^{13}$ each independently represent a hydrocarbon group or a heterocyclic group. Further, examples of the substituent include the substituents described in paragraph Nos. 0020 to 0022 of JP2009-263614A. Among those, as the substituent, an alkoxy group, a hydroxy group, a cyano group, a nitro group, —$OCOR^{11}$, —$SOR^{12}$, or —$SO_2R^{13}$ is preferable. As the group represented by each of $R^{1a}$ or $R^{1b}$, an aryl group having an alkoxy group having a branched alkyl group as a substituent, an aryl group having a hydroxy group as a substituent, or an aryl group having a group represented by —$OCOR^{11}$ as a substituent is preferable. The number of carbon atoms of the branched alkyl group is preferably 3 to 30, and more preferably 3 to 20.

It is preferable that at least one of $R^2$ or $R^3$ is an electron withdrawing group, and it is more preferable that $R^2$ represents an electron withdrawing group (preferably a cyano group) and $R^3$ represents a heteroaryl group. The heteroaryl group is preferably a 5- or 6-membered ring. Further, the heteroaryl group is preferably a monocycle or a fused ring, a monocycle or a fused ring having 2 to 8 fusions is preferable; and a monocycle or a fused ring having 2 to 4 fusions is more preferable. The number of heteroatoms constituting the heteroaryl group is preferably 1 to 3, and more preferably 1 or 2. Examples of the heteroatom include a nitrogen atom, an oxygen atom, and a sulfur atom. The heteroaryl group preferably has one or more nitrogen atoms. Two $R^2$'s in Formula (PP) may be the same as or different from each other. Further, two $R^3$'s in Formula (PP) may be the same as or different from each other.

$R^4$ is preferably a hydrogen atom, an alkyl group, an aryl group, a heteroaryl group, or a group represented by —$BR^{4A}R^{4B}$, more preferably a hydrogen atom, an alkyl group, an aryl group or a group represented by —$BR^{4A}R^{4B}$, and still more preferably a group represented by —$BR^{4A}R^{4B}$. As the substituent represented by each of $R^{4A}$ and $R^{4B}$, a halogen atom, an alkyl group, an alkoxy group, an aryl group, or a heteroaryl group is preferable, and an alkyl group, an aryl group, or a heteroaryl group is more preferable, and an aryl group is particularly preferable. Such a group may further have a substituent. Two $R^4$'s in Formula (PP) may be the same as or different from each other.

Specific examples of the compound represented by Formula (PP) include the following compounds. In the following structural formulae, Me represents a methyl group and Ph represents a phenyl group. Further, examples of the pyrrolopyrrole compound include the compounds described in paragraph Nos. 0016 to 0058 of JP2009-263614A, the compounds described in paragraph Nos. 0037 to 0052 of JP2011-068731A, and the compounds described in paragraph Nos. 0010 to 0033 of WO2015/166873A, the contents of which are incorporated herein by reference.

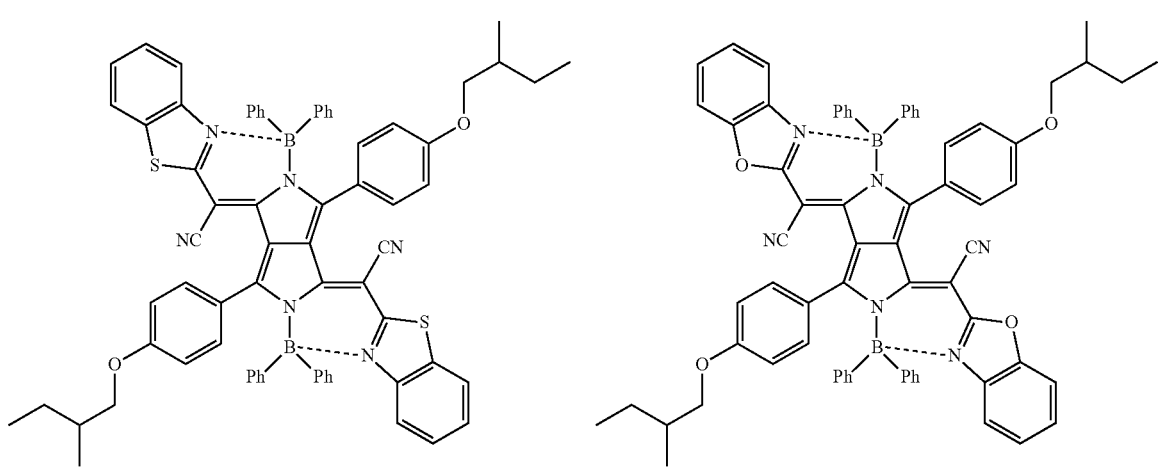

-continued

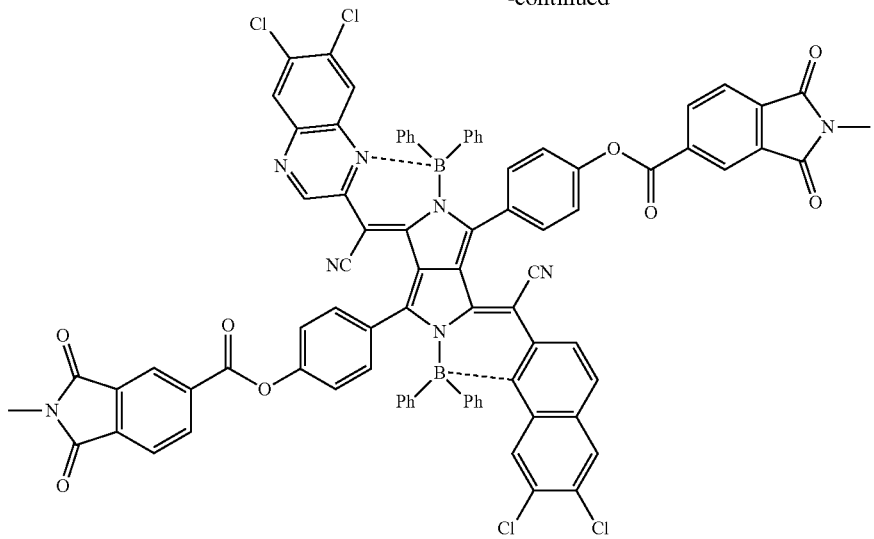

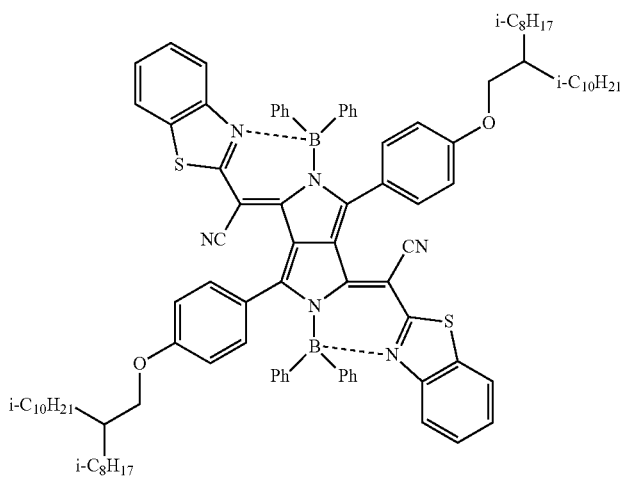

As the squarylium compound, a compound represented by Formula (SQ) is preferable.

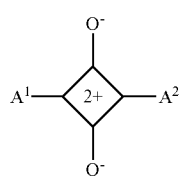
(SQ)

In Formula (SQ), $A^1$ and $A^2$ each independently represent an aryl group, a heteroaryl group, or a group represented by Formula (A-1);

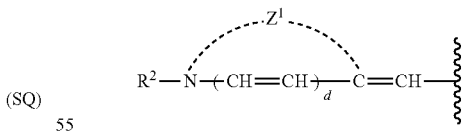
(A-1)

in Formula (A-1), $Z^1$ represents a non-metal atomic group that forms a nitrogen-containing heterocycle, $R^2$ represents an alkyl group, an alkenyl group, or an aralkyl group, d represents 0 or 1, and a wavy line represents a linking arm. With regard to the details of Formula (SQ), reference can be made to the description in paragraph Nos. 0020 to 0049 of JP2011-208101A, the contents of which are incorporated herein by reference.

Moreover, the cation in Formula (SQ) is present while not being localized as below.

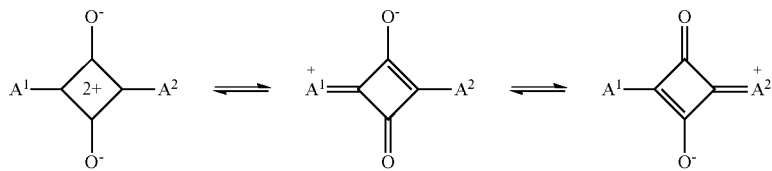

Examples of the squarylium compound include the compounds described in JP3094037B, JP1985-228448A (JP-S60-228448A), JP1989-146846A (JP-H01-146846A), JP1989-228960A (JP-H01-228960A), paragraph No. 0178 of JP2012-215806A, and paragraph Nos. 0044 to 0049 of JP2011-208101A, the contents of which are incorporated herein by reference.

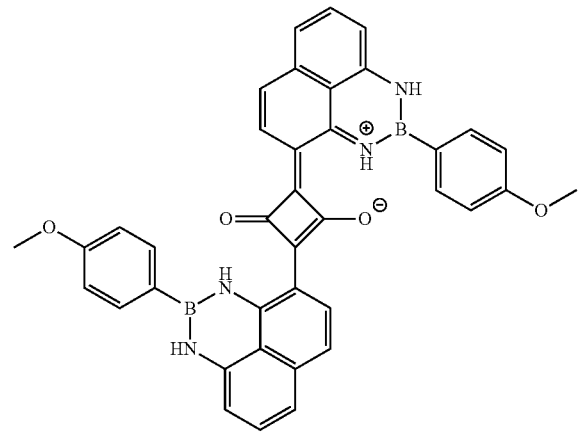

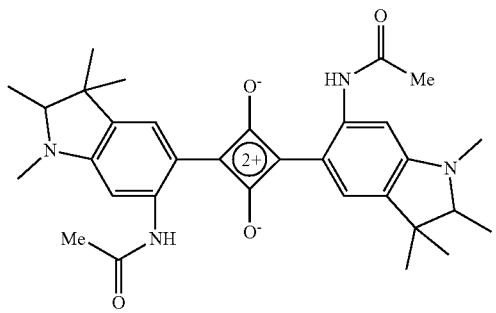

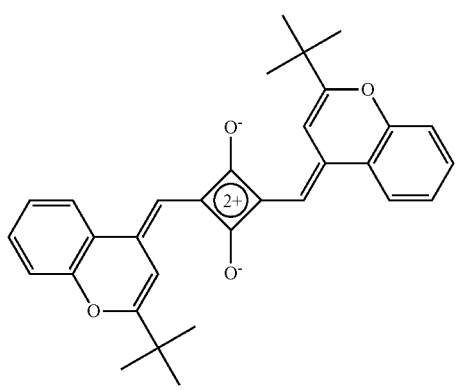

As the cyanine compound, a compound represented by Formula (C) is preferable.

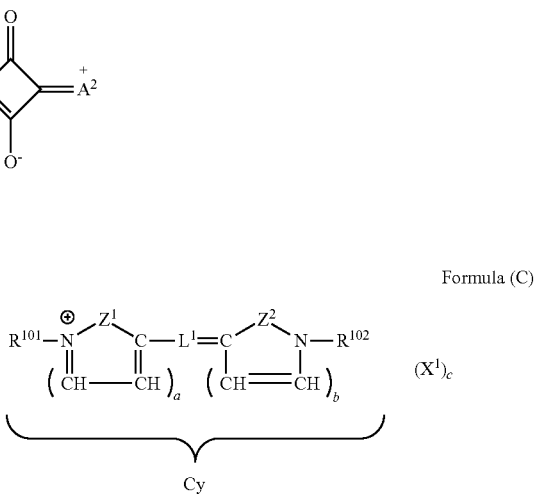

In the formula, $Z^1$ and $Z^2$ each independently represent a non-metal atomic group that forms a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain having an odd number of methine groups, a and b are each independently 0 or 1, in a case where a is 0, a carbon atom and a nitrogen atom are bonded to each other through a double bond, and in a case where b is 0, a carbon atom and a nitrogen atom are bonded to each other through a single bond, in a case where the moiety represented by Cy in the formula is a cation portion, $X^1$ represents an anion and c represents a number required to balance charges, in a case where the moiety represented by Cy in the formula is an anion portion, $X^1$ represents a cation and c is the number required to balance the charge, and in a case where the charge of the moiety represented by Cy in the formula is neutralized in the molecule, c is 0.

As the near-infrared absorbing dye, a commercially available product can also be used. Examples thereof include SDO-C33 (manufactured by Arimoto Chemical Co., Ltd.); EXCOLOR IR-14, EXCOLOR IR-10A, EXCOLOR TX-EX-801B, or EXCOLOR TX-EX-805K (manufactured by Nippon Shokubai Co., Ltd.), Shigenox NIA-8041, Shigenox NIA-8042, Shigenox NIA-814, Shigenox NIA-820, or Shigenox NIA-839 (manufactured by Hakkol Chemical Co., Ltd.), Epolite V-63, Epolight 3801, or Epolight3036 (manufactured by Epolin Inc.), PRO-JET 825LDI (manufactured by Fujifilm Corporation), NK-3027 or NK-5060 (manufactured by Hayashibara Co., Ltd.), and YKR-3070 (manufactured by Mitsui Chemicals, Inc.).

As a near-infrared screening agent, inorganic particles can also be used. The shape of the inorganic particles is not particularly limited and may have a sheet shape, a wire shape, or a tube shape, irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, a tungsten oxide-based compound can also be used. The tungsten oxide-based compound is preferably cesium tungsten oxide. With regard to the details of the tungsten oxide-based compound, reference can be made to the description in paragraph No. 0080 of JP2016-006476A, the contents of which are incorporated herein by reference.

The content of the near-infrared screening agent in the composition for forming a near-infrared cut layer is preferably 0.1% to 80% by mass with respect to the total solid content of the composition for forming a near-infrared cut layer. The upper limit is preferably 60% by mass or less, and more preferably 40% by mass or less. The lower limit is preferably 1% by mass or more, and more preferably 3% by mass or more. The composition for forming a near-infrared cut layer may include one kind or two or more kinds of the near-infrared screening agents. In a case where two or more kinds of the near-infrared screening agents are included, the total amount thereof is preferably within the range.

<<Polymerizable Compound>>

The composition for forming a near-infrared cut layer can contain a polymerizable compound. The polymerizable compound is a polymerizable compound by the action of a radical. That is, the polymerizable compound is preferably a radically polymerizable compound. The polymerizable compound is preferably a polymerizable compound having one or more groups having an ethylenically unsaturated bond, more preferably a compound having two or more groups having an ethylenically unsaturated bond, and still more preferably a compound having three or more groups having an ethylenically unsaturated bond. The upper limit of the number of the ethylenically unsaturated groups in the ethylenically unsaturated group-containing monomer is, for example, preferably 15 or less, and more preferably 6 or less. Examples of the group having an ethylenically unsaturated bond include a vinyl group, a styryl group, an allyl group, a methallyl group, and a (meth)acryloyl group, and the (meth)acryloyl group is preferable. The polymerizable compound is preferably a trifunctional to pentadecafunctional (meth)acrylate compound, and more preferably a trifunctional to hexafunctional (meth)acrylate compound.

The polymerizable compound may be in any form of a monomer and a polymer, and the monomer is preferable. The monomer type of the polymerizable compound preferably has a molecular weight of 100 to 3,000. The upper limit is preferably 2,000 or less, and more preferably 1,500 or less. The lower limit is preferably 150 or more, and more preferably 250 or more. Further, it is also preferable that the polymerizable compound is a compound that does not substantially have a molecular weight distribution. Here, an expression of not substantially having a molecular weight distribution means that a dispersity (weight-average molecular weight (Mw)/number-average molecular weight (Mn)) of the compound is preferably 1.0 to 1.5, and more preferably 1.0 to 1.3.

With regard to examples of the polymerizable compound, reference can be made to the description in paragraph Nos. 0033 and 0034 of JP2013-253224A, the contents of which are incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.); dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.); and a compound having a structure in which the (meth)acryloyl group is bonded through an ethylene glycol and/or a propylene glycol residue are preferable. In addition, oligomers of the above-described examples can also be used. Further, with regard to this, the description in paragraph Nos. 0034 to 0038 of JP2013-253224A, the contents of which are incorporated herein by reference. Examples of the compound include the polymerizable monomers described in paragraph No. 0477 of JP2012-208494A (corresponding to paragraph No. 0585 of US2012/0235099A), the contents of which are incorporated herein by reference. In addition, diglycerin ethylene oxide (EO)-modified (meth)acrylate (as a commercially available product, M-460 manufactured by Toagosei Co., Ltd.); pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can also be used. Examples thereof include RP-1040 (manufactured by Nippon Kayaku Co., Ltd.). In addition, the polymerizable compound can use ARONIX TO-2349 (manufactured by Toagosei Chemical Industry Co., Ltd.), NK OLIGO UA-7200 (manufactured by Shin-Nakamura Chemical Co., Ltd.), 8UH-1006, 8UH-1012 (manufactured by Taisei Fine Chemical Co., Ltd.), or the like.

The polymerizable compound may have an acid group such as a carboxyl group, a sulfo group, and a phosphate group. Examples of a commercially available product of the polymerizable compound having an acid group include ARONIX M-305, M-510, and M-520 (all of which are manufactured by Toagosei Co., Ltd.). The acid value of the polymerizable compound having an acid group is preferably 0.1 to 40 mgKOH/g. The lower limit is preferably 5 mgKOH/g or more. The upper limit is preferably 30 mgKOH/g or less.

It is also preferable that the polymerizable compound is a compound having a caprolactone structure. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and -caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, and trimethylolmelamine. With regard to examples of the polymerizable compound having a caprolactone structure, reference can be made to the description in paragraph Nos. 0042 to 0045 of JP2013-253224A, the contents of which are incorporated herein by reference. Examples of the polymerizable compound having a caprolactone structure include DPCA-20, DPCA-30, DPCA-60, DPCA-120, and the like which are commercially available as KAYARADDPCA series manufactured by Nippon Kayaku Co., Ltd.; SR-494 manufactured by Sartomer, which is a tetrafunctional acrylate having four ethyleneoxy chains, and TPA-330 which is a trifunctional acrylate having three isobutyleneoxy chains.

The content of the polymerizable compound is preferably 0.1% to 40% by mass with respect to the total solid content of the composition for forming a near-infrared cut layer. The lower limit is, for example, preferably 0.5% by mass or more, and still more preferably 1% by mass or more. The upper limit is, for example, more preferably 30% by mass or less, and still more preferably 20% by mass or less. The polymerizable compound may be used singly or in combination of two or more kinds thereof In a case where two or more kinds of the polymerizable compounds are used in combination, the total amount thereof is preferably within the range.

<<Photopolymerization Initiator>>

The composition for forming a near-infrared cut layer can contain a photopolymerization initiator. In particular, in a case where the composition for forming a near-infrared cut layer contains a polymerizable compound, it preferably further contains a photopolymerization initiator. The photopolymerization initiator is not particularly limited and can be appropriately selected from known photopolymerization initiators. For example, a compound having photosensitivity to light from the ultraviolet range to the visible range is preferable. The photopolymerization initiator is preferably a photoradical polymerization initiator.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of the exposure sensitivity, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an aminoacetophenoen compound, a cyclopentadiene-benzene-iron complex, a halomethyl oxadiazole compound, and a 3-aryl-substituted coumarin compound are preferable, a compound selected from an oxime compound, the α-hydroxyketone compound, the α-aminoketone compound, and the acylphosphine compound is more preferable, and the oxime compound is still more preferable. With regard to the photopolymerization initiator, reference can be made to the description in paragraphs 0065 to 0111 of JP2014-130173A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819 and DAROCUR-TPO (both of which are manufactured by BASF).

As the oxime compound, the compounds described in JP2001-233842A, the compounds described in JP2000-080068A, the compounds described in JP2006-342166A, the compounds described in JP2016-021012A, or the like can be used. Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Other examples of the oxime compound include the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A. As a commercially available product of the oxime compound, IRGACURE-OXE01, IRGACURE-OXE02, IRGACURE-OXE03, and IRGACURE-OXE04 (all of which are manufactured by BASF) are also suitably used. In addition, TRONLY TR-PBG-304 (manufactured by CHANGZHOU Changzhou Tronly New Electronic Materials Co., Ltd.) or ADEKA ARKLS NCI-831 (manufactured by ADEKA Corporation), ADEKA ARKLS NCI-930 (manufactured by ADEKA Corporation), and ADEKA OPTOMER N-1919 (manufactured by ADEKA Corporation, the photopolymerization initiator 2 described in JP2012-014052A) can also be used.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, each contents of which are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

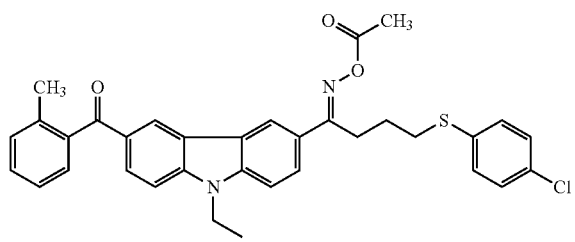

(C-1)

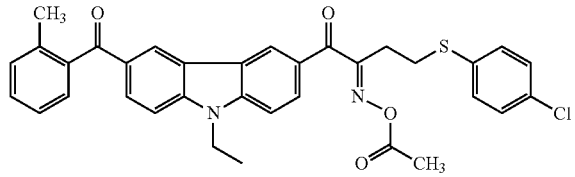

(C-2)

(C-3)
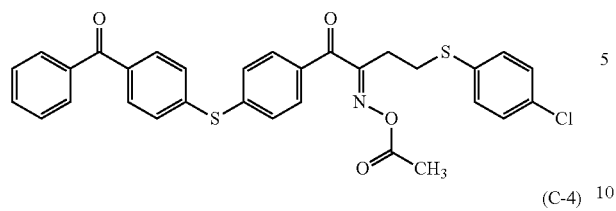
(C-4)
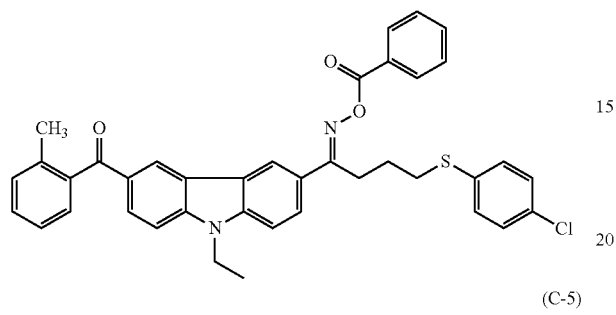
(C-5)
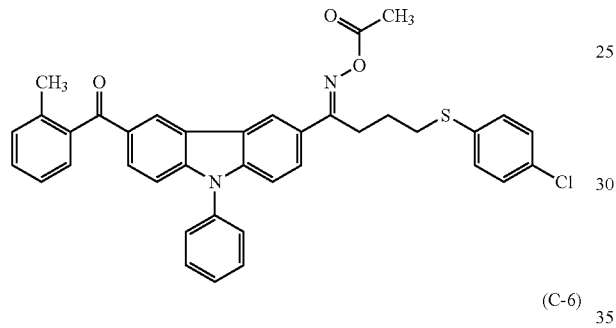
(C-6)
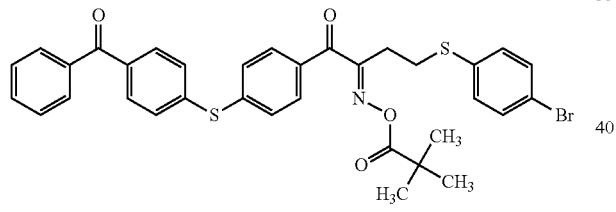
(C-7)
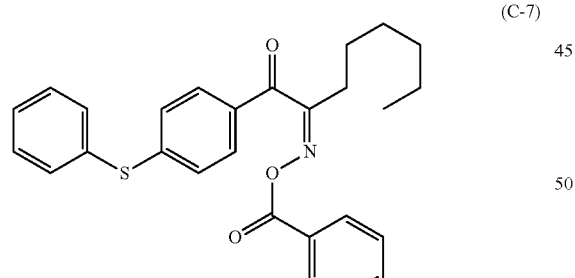
(C-8)
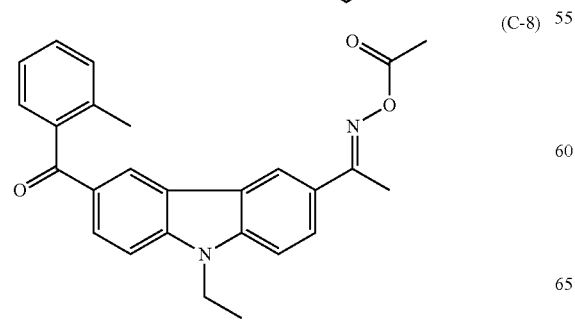
(C-9)
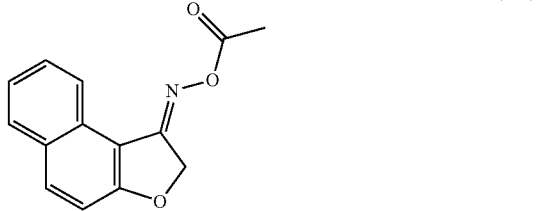
(C-10)
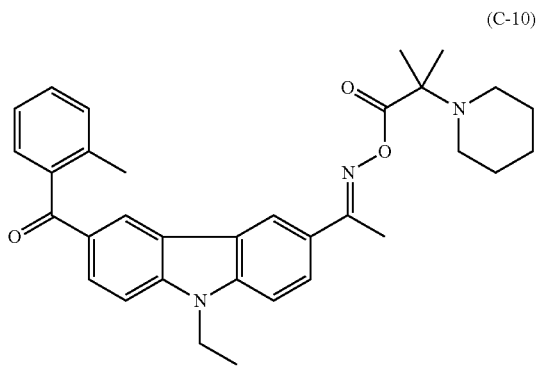
(C-11)
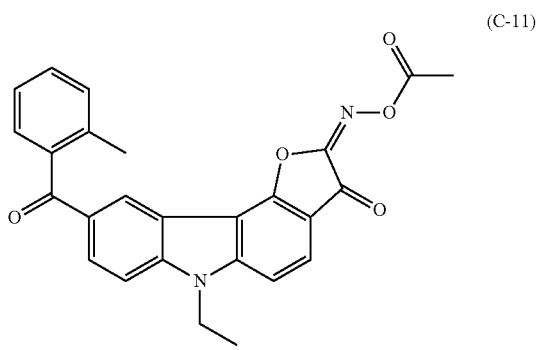
(C-12)
(C-13)
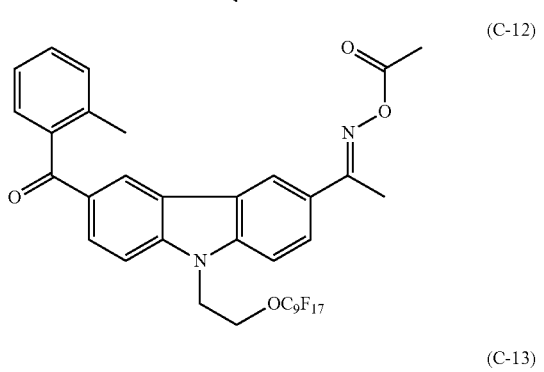

-continued (C-14)

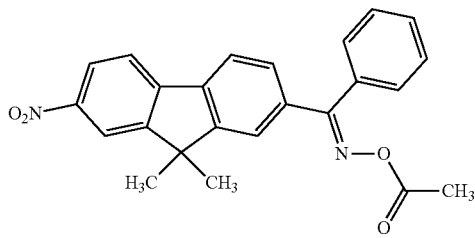

As the oxime compound, the compound having a maximum absorption wavelength in a wavelength range of 350 nm to 500 nm is preferable, the compound having a maximum absorption wavelength in a wavelength range of 360 nm to 480 nm is more preferable. Further, the oxime compound is preferably a compound having high absorbances at 365 nm and 405 nm. From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of a spectrophotometer (Cary-5 spectrophotometer manufactured by Varian) at a concentration of 0.01 g/L using an ethyl acetate solvent.

It is also preferable that the photopolymerization initiator includes an oxime compound and an α-aminoketone compound. By using the oxime compound and the α-aminoketone compound in combination, the developability is improved and a pattern having excellent rectangularity is likely to be formed. In a case where the oxime compound and the α-aminoketone compound are used in combination, the content of the α-aminoketone compound is preferably 50 to 600 parts by mass, and more preferably 150 to 400 parts by mass, with respect to 100 parts by mass of the oxime compound.

The content of the photopolymerization initiator is preferably 0.1% to 50% by mass, more preferably 0.5% to 30% by mass, and still more preferably 1% to 20% by mass, with respect to the total solid content of the composition for forming a near-infrared cut layer. In a case where the content of the photopolymerization initiator is within the range, the developability is good. The composition for forming a near-infrared cut layer may include only one kind or two or more kinds of the photopolymerization initiators. In a case where two or more kinds of the photopolymerization initiators are included, the total amount thereof is preferably within the range.

<<Resin>>

The composition for forming a near-infrared cut layer of the embodiment of the present invention can contain a resin. The resin is blended in, for example, an application for dispersing a pigment and the like in a composition or an application as a binder. Incidentally, a resin which is used for dispersing a pigment and the like in a composition is also referred to as a dispersant. However, such uses of the resin are only exemplary, and the resin can also be used for other purposes, in addition to such uses.

The weight-average molecular weight (Mw) of the resin is preferably 2,000 to 2,000,000. The upper limit is preferably 1,000,000 or less, and more preferably 500,000 or less. The lower limit is preferably 3,000 or more, and more preferably 5,000 or more. Further, in a case of the epoxy resin, the weight-average molecular weight (Mw) of the epoxy resin is preferably 100 or more, and more preferably 200 to 2,000,000. The upper limit is preferably 1,000,000 or less, and more preferably 500,000 or less. The lower limit is preferably 150 or more, and more preferably 200 or more.

Examples of the resin include a (meth)acrylic resin, an epoxy resin, an ene-thiol resin, a polycarbonate resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. As the cyclic olefin resin, a norbornene resin can be preferably used from the viewpoint of improvement of heat resistance. Examples of a commercially available product of the norbornene resin include ARTON Series manufactured by JSR Corporation (for example, ARTON F4520). Examples of the epoxy resin include an epoxy resin which is a glycidyl etherified product of a phenol compound, an epoxy resin which is a glycidyl etherified product of various novolac resins, an alicyclic epoxy resin, an aliphatic epoxy resin, a heterocyclic epoxy resin, a glycidyl ester epoxy resin, a glycidyl amine-based epoxy resin, an epoxy resin which is a glycidylated product of a halogenated phenol, a fused product of a silicon compound having an epoxy group and another silicon compound, and a copolymer of a polymerizable unsaturated compound having an epoxy group and another polymerizable unsaturated compound. Further, MARPROOF G-0150M, G-0105SA, G-0130SP, G-0250SP, G-1005S, G-1005SA, G-1010S, G-2050M, G-01100, and G-01758 (all of which are manufactured by NOF Corporation, epoxy group containing polymer), EHPE3150 (manufactured by Daicel Chemical Industries, Ltd.), EPICLON N-695 (manufactured by DIC Corporation), or the like can also be used. Further, as the resin, the resins described in Examples of WO2016/088645A can also be used.

The resin which is used in the present invention may have an acid group. Examples of the acid group include a carboxyl group, a phosphoric acid group, a sulfo group, and a phenolic hydroxyl group. These acid groups may be of only one kind or of two or more kinds thereof. The resin having an acid group may also be used as an alkali-soluble resin.

As the resin having an acid group, a polymer having a carboxyl group in a side chain is preferable. Specific examples thereof include a methacrylic acid copolymer, an acrylic acid copolymer, an itaconic acid copolymer, an crotonic acid copolymer, a maleic acid copolymer, a partially esterified maleic acid copolymer, alkali-soluble phenol resins such as a novolac resin, an acidic cellulose derivative having a carboxyl group in a side chain, and a resin obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and glycidyl (meth)acrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of only one kind or of two or more kinds thereof.

The resin having an acid group may further have a polymerizable group. Examples of the polymerizable group include a (meth)allyl group and a (meth)acryloyl group. Examples of a commercially available product thereof include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a benzyl (meth)acrylate/(meth)acrylic acid copolymer, a benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a copolymer obtained by copolymerizing 2-hydroxyethyl (meth)acrylate and other monomers, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used.

With regard to the resin having an acid group, reference can be made to the description in paragraph Nos. 0558 to 0571 of JP2012-208494A (paragraph Nos. 0685 to 0700 of the corresponding US2012/0235099A) and paragraph Nos. 0076 to 0099 of JP2012-198408A, each contents of which are incorporated herein by reference. Incidentally, a commercially available product of the resin having an acid group can also be used. Examples thereof include ACRYLBASE FF-426 (manufactured by Fujikura Kasei Co., Ltd.).

The acid value of the resin having an acid group is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and even still more preferably 120 mgKOH/g or less.

Examples of the resin having an acid group include a resin having the following structure. In the following structural formulae, Me represents a methyl group.

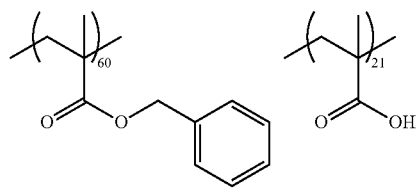

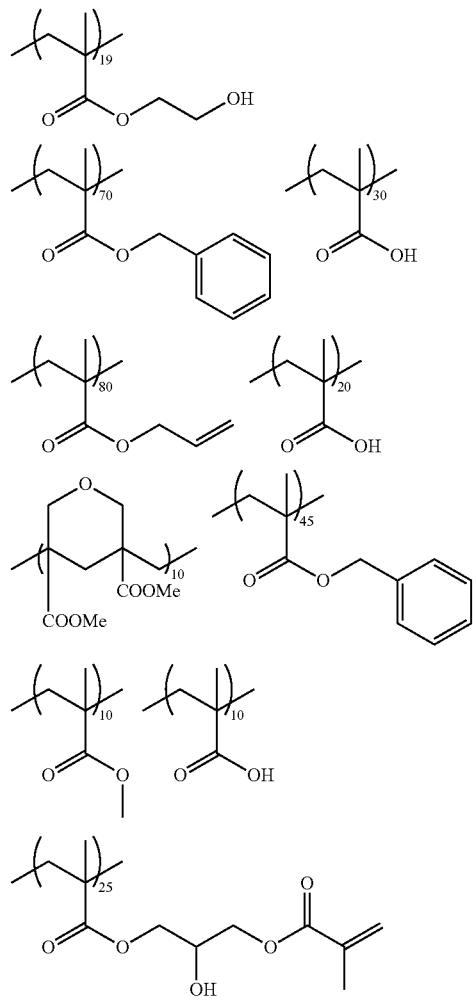

The composition for forming a near-infrared cut layer preferably includes a resin as the dispersant. As the resin that acts as a dispersant, an acidic resin and/or a basic resin. Here, the acidic resin represents a resin in which the amount of the acid group is larger than the amount of the basic group. The acidic resin is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group occupies 50% by mole or more in a case where the total amount of the acid group and the basic group is 100% by mole. The basic group contained in the basic dispersant is preferably an amino group.

The resin which is used as the dispersant is preferably a resin including a repeating unit having an acid group. By incorporating the repeating unit having an acid group into the resin used as the dispersant, residues generated in the underlying substrate of pixels upon formation of a pattern by photolithography can further be reduced.

It is also preferable that the resin used as the dispersant is a graft copolymer. Since the graft copolymer has affinity with a solvent due to its the graft chain, it is excellent in dispersibility of a pigment and dispersion stability after curing. With regard to the details of the graft copolymer, reference can be made to the description in paragraph Nos. 0025 to 0094 of JP2012-255128A, the contents of which are incorporated herein by reference. Further, specific examples of the graft copolymer include the following copolymers. The following resins are also resins having an acid group (alkali-soluble resins). In addition, examples of the graft copolymer include the resins described in paragraph Nos. 0072 to 0094 of JP2012-255128A, the contents of which are incorporated herein by reference.

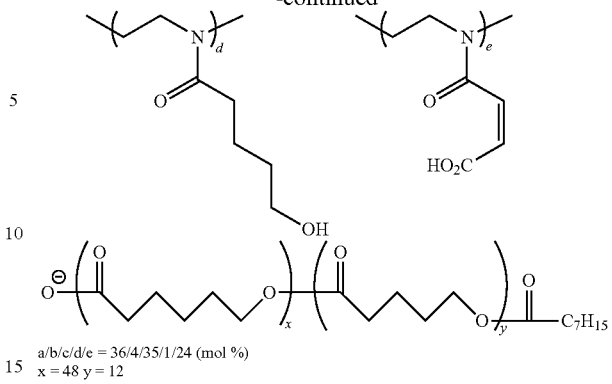

a/b/c/d/e = 36/4/35/1/24 (mol %)
x = 48 y = 12

The dispersant is also commercially available as a commercially available product, and specific examples thereof include Disperbyk-111 (manufactured by BYK Chemie) and SOLSEPERSE 76500 (manufactured by Lubrizol Japan Ltd.). Further, the pigment dispersant described in paragraph

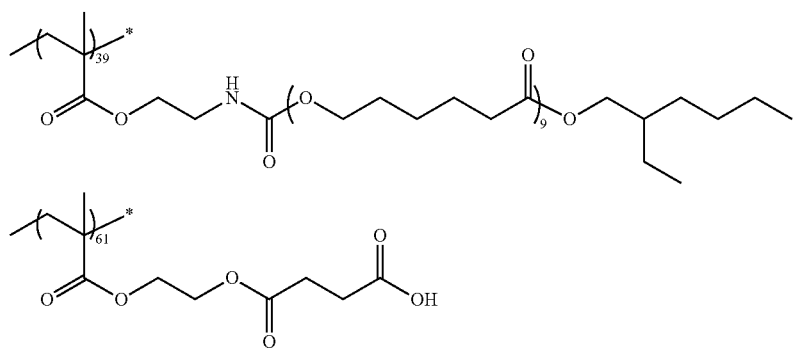

Furthermore, in the present invention, it is also preferable that the resin (dispersant) uses an oligoimine-based dispersant including a nitrogen atom at at least one of a main chain or a side chain. As the oligoimine-based dispersant, a resin having a side chain including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity. With regard to the oligoimine-based dispersant, reference can be made to the description in paragraph Nos. 0102 to 0166 of JP2012-255128A, the contents of which are incorporated herein by reference. Specific examples include the following dispersants. The following resins are also resins having an acid group. Further, as the oligoimine-based dispersant, the resins described in paragraph Nos. 0168 to 0174 of JP2012-255128A can be used.

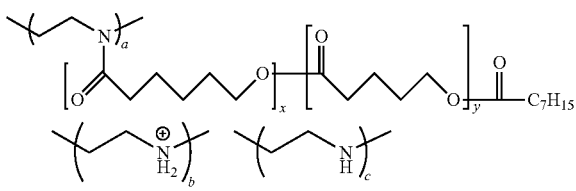

Nos. 0041 to 0130 of JP2014-130338A can also be used, the contents of which are incorporated herein by reference. Further, the above-mentioned resin having an acid group or the like can also be used as the dispersant.

The content of the resin is preferably 0.1% by mass or more, more preferably 1% by mass or more, still more preferably 10% by mass or more, and particularly preferably 20% by mass or more, with respect to the total solid content of the composition for forming a near-infrared cut layer. The upper limit is preferably 90% by mass or less, more preferably 70% by mass or less, and still more preferably 50% by mass or less.

In a case where the composition for forming a near-infrared cut layer includes a resin having an acid group, the content of the resin having an acid group is preferably 0.1% by mass or more, more preferably 1% by mass or more, still more preferably 10% by mass or more, and particularly preferably 20% by mass or more, with respect to the total solid content of the composition for forming a near-infrared cut layer. The upper limit is preferably 90% by mass or less, more preferably 70% by mass or less, and still more preferably 50% by mass or less.

<<Solvent>>

The composition for forming a near-infrared cut layer preferably contains a solvent. Examples of the solvent include an organic solvent. Basically, the solvent is not particularly limited as long as it satisfies the solubility of the respective components or the coatability of the composition for forming a near-infrared cut layer. Examples of the organic solvent include esters, ethers, ketones, and aromatic hydrocarbons. With regard to the details of the organic solvent, reference can be made to the description in paragraph No. 0223 of WO2015/166779A, the contents of which are incorporated herein by reference. Further, an ester-based solvent substituted with a cyclic alkyl group or a ketone-based solvent substituted with a cyclic alkyl group can also be preferably used. Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, and propylene glycol monopropyl ether acetate. Examples of the ketones include methyl ethyl ketone, cyclohexanone, cyclopentanone, 2-heptanone, and 3-heptanone. Suitable examples of the aromatic hydrocarbons include toluene and xylene. However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for reasons such as an environmental aspect.

In the present invention, it is preferable to use an organic solvent having a small metal content, and for example, the metal content of the organic solvent is preferably 10 parts per billion (ppb) by mass or less. The metal content of the organic solvent is at a level of parts per trillion (ppt), as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (for example, molecular distillation and thin-film distillation) and filtering using a filter. The pore diameter of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). Further, the solvent may include only one isomer or a plurality of isomers.

In the present invention, as the organic solvent, an organic solvent containing 0.8 mmol/L or less of a peroxide is preferable, and an organic solvent substantially not including a peroxide is more preferable.

The content of the solvent is preferably 10% to 90% by mass, more preferably 20% to 80% by mass, and still more preferably 25% to 75% by mass with respect to the total amount of the composition for forming a near-infrared cut layer. In a case where two or more kinds of the solvents are used, the total amount thereof is preferably within the range.

<<Pigment Derivative>>

In a case where the composition for forming a near-infrared cut layer includes a pigment, it is preferable that the composition for forming a near-infrared cut layer may further include a pigment derivative. Examples of the pigment derivative include a compound having a structure in which a part of a pigment is substituted with an acidic group, a basic group, a phthalimidomethyl group, or the like, such as an acid pigment derivative, a basic pigment derivative, and a neutral pigment derivative. As the pigment derivative, a compound represented by Formula (B1) is preferable.

$$P\text{-}(\text{-}L\text{-}(X)_n)_m \quad \quad (B1)$$

In Formula (B1), P represents a dye structure, L represents a single bond or a linking group, X represents an acidic group, a basic group, a group having a salt structure, or a phthalimidomethyl group, m represents an integer of 1 or more, n represents an integer of 1 or more, in a case where m represents 2 or more, a plurality of L's and a plurality of X's may be the same as or different from each other, and in a case where n represents 2 or more, a plurality of X's may be the same as or different from each other.

In Formula (B1), as the dye structure represented by P, at least one selected from a pyrrolopyrrole dye structure, a diketopyrrolopyrrole dye structure, a quinacridone dye structure, an anthraquinone dye structure, a dianthraquinone dye structure, a benzoisoindole dye structure, a thiazine indigo dye structure, an azo dye structure, a quinophthalone dye structure, a phthalocyanine dye structure, a naphthalocyanine dye structure, a dioxazine dye structure, a perylene dye structure, a perinone dye structure, a benzimidazolone dye structure, a benzothiazole dye structure, a benzimidazole dye structure, or a benzoxazole dye structure is preferable, at least one selected from a pyrrolopyrrole dye structure, a diketopyrrolopyrrole dye structure, a quinacridone dye structure, or a benzimidazolone dye structure is more preferable, and a pyrrolopyrrole dye structure is still more preferable.

In Formula (B1), L represents a single bond or a linking group. The linking group is preferably a group formed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acidic group, a basic group, a group having a salt structure, or a phthalimidomethyl group.

Specific examples of the pigment derivative include the following compounds. In addition, for example, the compounds described in JP1981-118462A (JP-S56-118462A), JP1988-264674A (JP-S63-264674A), JP1989-217077A (JP- H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-1106-145546A), JP1994-212088A (JP-H06-212088A), JP1996-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, and paragraph No. 0053 of WO2016/035695A, the compounds described in paragraph Nos. 0027 to 0031 of JP2011-038061A, the compounds described in paragraph No. 0036 of JP2010-181812A, the compounds described in paragraph Nos. 0027 to 0035 of JP2004-258134, or the like can also be used, the contents of which are incorporated herein by reference.

gation of particles can be effectively suppressed. The pigment derivative may be used alone or in combination of two or more kinds thereof in combination. In a case where two or more kinds of the pigment derivatives are used, the total amount thereof is preferably within the range.

<<Polymerization Inhibitor>>

The composition for forming a near-infrared cut layer can contain a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxylamine salt (for example, an ammonium salt and a cerium (III) salt). Among these, p-methoxyphenol is preferable. The content of the polymerization inhibitor is

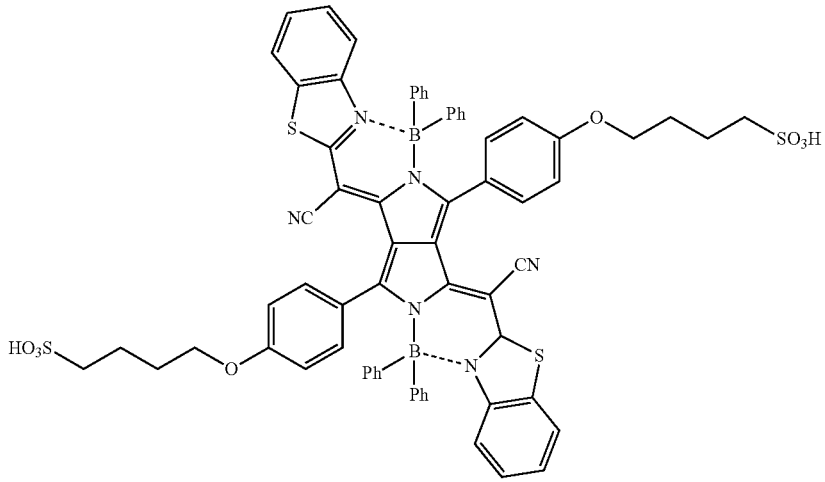

1

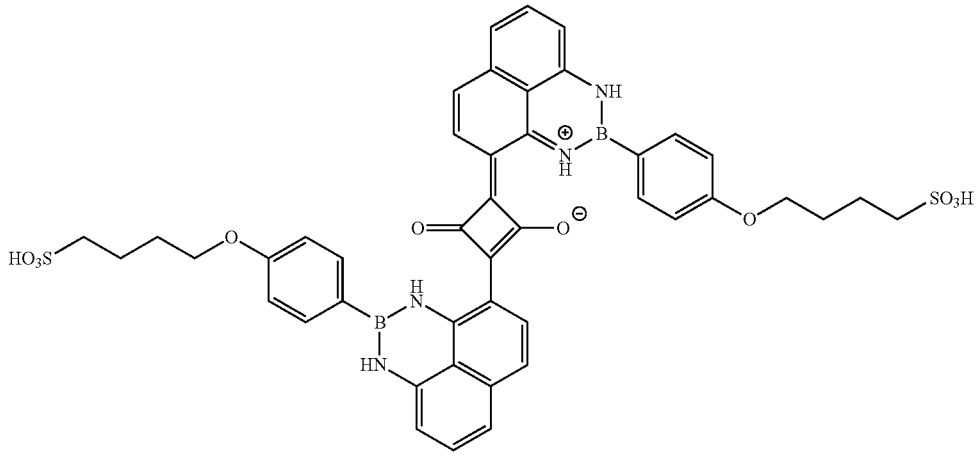

2

In a case where the composition for forming a near-infrared cut layer includes the pigment derivative, the content of the pigment derivative is preferably 1 to 50 parts by mass with respect to 100 parts by mass of the pigment. The lower limit value is preferably 3 parts by mass or more, and more preferably 5 parts by mass or more. The upper limit value is preferably 40 parts by mass or less, and more preferably 30 parts by mass or less. In a case where the content of the pigment derivative is within the range, the dispersibility of the pigment can be improved, and aggrepreferably 0.01% to 5% by mass with respect to the total solid content of the composition for forming a near-infrared cut layer.

<<Surfactant>>

The composition for forming a near-infrared cut layer may contain a surfactant from the viewpoint of further improving coatability. As the surfactant, various surfactants such as a fluorine-based surfactant, a nonionic surfactant, a cationic surfactant, an anionic surfactant, and a silicone-based surfactant can be used.

By incorporating the fluorine-based surfactant into the composition for forming a near-infrared cut layer, liquid characteristics in a case of preparation of a coating liquid are further improved, and thus, the evenness of coating thickness can be further improved. That is, in a case where a film is formed using to which a composition containing the fluorine-based surfactant has been applied, the interface tension between a surface to be coated and the coating liquid is reduced to improve wettability with respect to the surface to be coated, and enhance coatability with respect to the surface to be coated. Therefore, formation of a film with a uniform thickness which exhibits little coating unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties.

Specific examples of the fluorine-based surfactant include the surfactants described in paragraph Nos. 0060 to 0064 of JP2014-041318A (paragraph Nos. 0060 to 0064 of corresponding WO2014/017669A), and the surfactants described in paragraph Nos. 0117 to 0132 of JP2011-132503A, the contents of which are incorporated herein by reference. Examples of a commercially available product of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all of which are manufactured by DIC Corporation), FLUORAD FC430, FLUORAD FC431, and FLUORAD FC171 (all of which are manufactured by Sumitomo 3M Ltd.), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and KH-40 (all of which are manufactured by Asahi Glass Co., Ltd.), and PolyFox PF636, PF656, PF6320, PF6520, and PF7002 (all of which are manufactured by OMNOVA Solutions Inc.).

Moreover, as the fluorine-based surfactant, an acrylic compound in which by application of heat to a molecular structure containing a functional group having a fluorine atom, in which the functional group containing a fluorine atom is cut to volatilize a fluorine atom, can also be suitably used. Examples of the fluorine-based surfactant include MEGAFACE DS series manufactured by DIC Corporation (The Chemical Daily, Feb. 22, 2016) (Nikkei Business Daily, Feb. 23, 2016), for example, MEGAFACE DS-21, which can also be used.

As the fluorine-based surfactant, a block polymer can also be used. Examples thereof include the compounds described in JP2011-089090A. As the fluorine-based surfactant, a fluorine atom-containing polymer compound can be preferably used, in which the fluorine-containing polymer compound includes a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). The following compound is also exemplified as the fluorine-based surfactant which is used in the present invention.

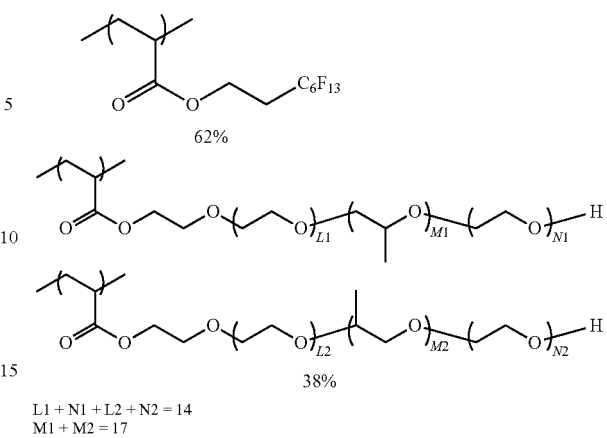

$L1 + N1 + L2 + N2 = 14$
$M1 + M2 = 17$

The weight-average molecular weight of the compounds is preferably 3,000 to 50,000, and is, for example 14,000. In the compounds, % representing the ratio of the repeating units is % by mass.

Moreover, a fluorine-containing polymer having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A, for example, MEGAFACE RS-101, RS-102, RS-718-K, and RS-72-K, manufactured by DIC Corporation. As the fluorine-based surfactant, the compounds described in paragraph Nos. 0015 to 0158 of JP2015-117327A can also be used.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP341, KF6001, and KF6002 (all of which are manufactured by Shin-Etsu Chemical Co., Ltd.), and BYK307, BYK323, and BYK330 (all of which are manufactured by BYK Chemie).

The content of the surfactant is preferably 0.001% to 2.0% by mass, and more preferably 0.005% to 1.0% by mass, with respect to the total solid content of the composition for forming a near-infrared cut layer. The surfactant may be used alone or in combination of two or more kinds thereof.

<<Silane Coupling Agent>>

The composition for forming a near-infrared cut layer may contain a silane coupling agent. In the present invention, the silane coupling agent means a silane compound having a hydrolyzable group and a functional group other than the hydrolyzable group. Further, the hydrolyzable group refers to a substituent which is directly linked to a silicon atom and is capable of forming a siloxane bond due to at least one of a hydrolysis reaction or a condensation reaction. Examples of the hydrolyzable group include a halogen atom, an alkoxy group, and an acyloxy group, and the alkoxy group is preferable. That is, it is preferable that the silane coupling agent is a compound having an alkoxysilyl group. In addition, it is preferable that the functional group other than the hydrolyzable group is a group which interacts with the resin or forms a bond with the resin to exhibit affinity. Examples of the functional group other than the hydrolyzable group include a vinyl group, a styryl group, a (meth)acryloyl group, a mercapto group, an epoxy group, an oxetanyl group, an amino group, a ureido group, a sulfide group, an isocyanate group, and a phenyl group, and the (meth)acryloyl group or the epoxy group is preferable. Examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent is preferably 0.01% to 15.0% by mass, and more preferably 0.05% to 10.0% by mass, with respect to the total solid content of the composition for forming a near-infrared cut layer. The silane coupling agents may be of only one kind or of two or more kinds. In a case where two or more kinds of the silane coupling agents are used, the total amount thereof is preferably within the range.

<<Ultraviolet Absorber>>

The composition for forming a near-infrared cut layer may contain an ultraviolet absorber. As the ultraviolet absorber, a conjugated diene compound, an aminobutadiene compound, a methyldiebenzoyl compound, a coumarin compound, a salicylate compound, a benzophenone compound, a benzotriazole compound, an acrylonitrile compound, a hydroxyphenyltriazine compound, or the like can be used. With regard to the details thereof, reference can be made to the description in paragraph Nos. 0052 to 0072 of JP2012-208374A and paragraph Nos. 0317 to 0334 of JP2013-068814A, the contents of which are incorporated herein by reference. Examples of commercially available products of the conjugated diene compound include UV-503 (manufactured by Daito Chemical Co., Ltd.). Examples of commercially available products of the hydroxyphenyltriazine compound include TINUVIN 400, TINUVIN 405, TINUVIN 460, TINUVIN 477, and TINUVIN 479 (all of which are manufactured by BASF). As the benzotriazole compound, MYUA series manufactured by Miyoshi Oil&Fat Co., Ltd. (The Chemical Daily, Feb. 1, 2016) may be used. In addition, as the ultraviolet absorber, compounds represented by Formula (UV-1) to Formula (UV-3) are preferable, a compound represented by Formula (UV-1) or Formula (UV-3) is more preferable, and a compound represented by Formula (UV-1) is still more preferable.

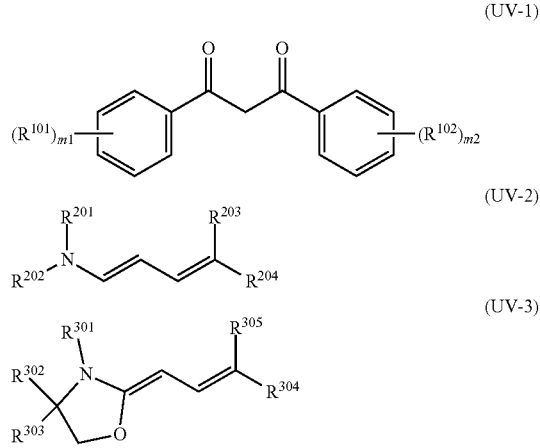

In Formula (UV-1), $R^{101}$ and $R^{102}$ each independently represent a substituent, and m1 and m2 each independently represent 0 to 4.

In Formula (UV-2), $R^{201}$ and $R^{202}$ each independently represent a hydrogen atom or an alkyl group, and $R^{203}$ and $R^{204}$ each independently represent a substituent.

In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formula (UV-1) to Formula (UV-3) include the following compounds.

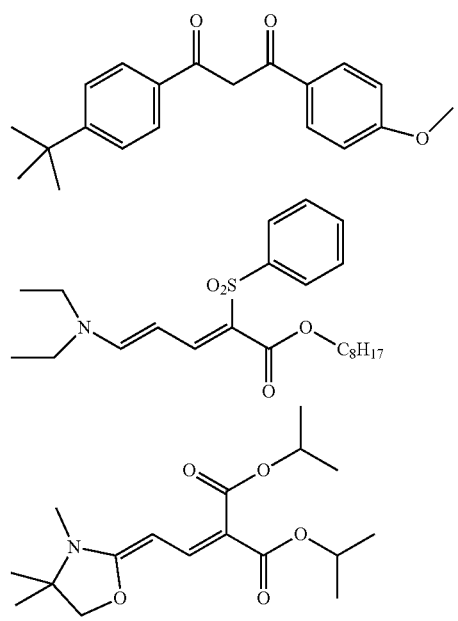

The content of the ultraviolet absorber is preferably 0.01% to 10% by mass, and more preferably 0.01% to 5% by mass, with respect to the total solid content of the composition for forming a near-infrared cut layer. In the present invention, the ultraviolet absorber may be used alone or in combination of two or more kinds thereof. In a case where two or more kinds of the silane coupling agents are used, the total amount thereof is preferably within the range.

<<Antioxidant>>

The composition for forming a near-infrared cut layer may contain an antioxidant. Examples of the antioxidant include a phenol compound, a phosphite compound, and a thioether compound. As the phenol compound, any of compounds which are known as a phenol antioxidant can be used. Preferred examples of the phenol compound include a hindered phenol compound. A compound having a substituent at a position (ortho-position) adjacent to a phenolic hydroxyl group is preferable. As the above-mentioned substituent, a substituted or unsubstituted alkyl group having 1 to 22 carbon atoms is preferable. Further, an antioxidant having a phenol group and a phosphite group in the same molecule is also preferable. In addition, as the antioxidant, a phosphorus-based antioxidant can also be suitably used. Examples of the phosphorous-based antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl) phosphite. Examples of a commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by ADEKA Corporation).

The content of the antioxidant is preferably 0.01% to 20% by mass, and more preferably 0.3% to 15% by mass, with respect to the total solid content of the composition for forming a near-infrared cut layer. The antioxidant may be used alone or in combination of two or more kinds thereof. In a case where two or more kinds of the antioxidants are used, the total amount thereof is preferably within the range.

<<Other Components>>

The composition for forming a near-infrared cut layer may contain a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent), as desired. By appropriately incorporating the components into the composition, properties such as film physical properties can be adjusted. With regard to the details of the components, can be found in, for example, paragraph No. 0183 or later of JP2012-003225A (corresponding to paragraph No. 0237 of US2013/0034812A), paragraph Nos. 0101 to 0104, and 0107 to 0109 of JP2008-250074A, and the like, the contents of which are incorporated herein by reference.

For example, in a case where a film is formed by coating, the viscosity (23° C.) of the composition for forming a near-infrared cut layer is preferably in a range of 1 to 3,000 mPa·s, for example. The lower limit is preferably 3 mPa·s or more, and more preferably 5 mPa·s or more. The upper limit is preferably 2,000 mPa·s or less, and more preferably 1,000 mPa·s or less.

<Composition for Forming Infrared Transmitting Layer>

Next, the composition for forming an infrared transmitting layer which can be used for formation of an infrared transmitting layer will be described. The composition for forming an infrared transmitting layer has a ratio of the minimum value Amin in an absorbance in a wavelength range of 400 to 640 nm to the maximum value Bmax in an absorbance in a wavelength range of 1,100 to 1,300 nm, Amin/Bmax, of preferably 5 or more, more preferably 7.5 or more, still more preferably 15 or more, and even still more preferably 30 or more.

With regard to the composition for forming an infrared transmitting layer, the conditions of the absorbance can be suitably satisfied, for example, by adjusting the kind and content of a light shielding material described later.

An absorbance $A\lambda$ at a certain wavelength $\lambda$ is defined by Expression (1).

$$A\lambda=-\log(T\lambda/100) \quad (1)$$

$A\lambda$ is an absorbance at a wavelength $\lambda$ and $T\lambda$ represents a transmittance (%) at the wavelength $\lambda$.

In the present invention, a value of the absorbance may be a value measured in the form of a solution or a value of a film which is formed using the composition. In a case where the absorbance is measured in the state of the film, it is preferable that the absorbance is measured using a film prepared by applying the composition onto a glass substrate using a method such as spin coating such that the thickness of the dried film is a predetermined value, and drying the applied composition using a hot plate at 100° C. for 120 seconds. The thickness of the film can be measured using a stylus surface profilometer (DEKTAK 150, manufactured by ULVAC Inc.) onto a substrate including the film.

Moreover, the absorbance can be measured using a well-known spectrophotometer of the related art. A measurement condition for the absorbance is not particularly limited, but it is preferable that a maximum value Bmax in the absorbance in a wavelength range of 1,100 to 1,300 nm is measured under conditions which are adjusted such that the minimum value Amin in the absorbance in a wavelength range of 400 to 640 nm is 0.1 to 3.0. By measuring the absorbance under such conditions, a measurement error can be further reduced. A method of adjusting the minimum value Amin in the absorbance in a wavelength range of 400 to 640 nm to be 0.1 to 3.0 is not particularly limited. For example, in a case where the absorbance is measured in the state of a composition, for example, a method of adjusting the optical path length of a sample cell may be mentioned. In addition, in a case where the absorbance is measured in the state of a film, for example, a method of adjusting the thickness of the film may be mentioned.

<<Light Shielding Material>>

It is preferable that the composition for forming an infrared transmitting layer contains a light shielding material. The light shielding material is preferably a color material that absorbs light in a wavelength range from violet to red. Further, the light shielding material is preferably a color material that shields visible light is a coloring material that shields light in a wavelength range of 400 to 640 nm. In addition, the light shielding material is preferably a color material that transmits light at a wavelength of 1,100 to 1,300 nm. The light shielding material preferably satisfies at least one of the following requirement (1) or (2).

(1): The light shielding material includes two or more chromatic coloring agents, and a combination of the two or more chromatic coloring agents forms black.

(2): The light shielding material includes an organic black coloring agent. In the aspect (2), it is preferable that the color material further includes a chromatic coloring agent.

Moreover, in the present invention, the chromatic coloring agent means a coloring agent other than a white coloring agent and a black coloring agent. Further, in the present invention, the organic black coloring agent used for the light shielding material means a material that absorbs visible light but transmits at least a part of infrared light. Accordingly, in the present invention, the organic black coloring agent used for the light shielding material does not include a black coloring agent that absorbs both visible light and infrared light, for example, carbon black and titanium black. It is preferable that the organic black coloring agent is a coloring agent having an absorption maximum in a wavelength range from 400 nm to 700 nm.

It is preferable that the light shielding material is a material in which a ratio A/B of a minimum value A of an absorbance in a wavelength range of 400 to 640 nm to a maximum value B of an absorbance in a wavelength range of 1,100 to 1,300 nm is 4.5 or more. The above-described characteristics may be satisfied using one material alone or using a combination of a plurality of materials. For example, in a case of the aspect (1), it is preferable that the spectral characteristics are satisfied using a combination of a plurality of chromatic coloring agents. In addition, in a case of the aspect (2), the spectral characteristics may be satisfied using an organic black coloring agent. In addition, the spectral characteristics may be satisfied using a combination of an organic black coloring agent and a chromatic coloring agent.

(Chromatic Coloring Agent)

As the chromatic coloring agent, a coloring agent selected from a red coloring agent, a green coloring agent, a blue coloring agent, a yellow coloring agent, a violet coloring agent, and an orange coloring agent is preferable. In the present invention, the chromatic coloring agent may be either a pigment or a dye, and is preferably the pigment. It is preferable that an average particle diameter (r) of the pigment satisfies preferably 20 nm≤r≤300 nm, more preferably 25 nm≤r≤250 nm, and still more preferably 30 nm≤r≤200 nm. "Average particle diameter" as mentioned herein means the average particle diameter for secondary particles to which primary particles of the pigment are aggregated. In addition, with regard to a particle size distribution of the secondary particles of the pigment (hereinafter, simply referred to as "particle size distribution") which can be used, secondary particles having a particle diameter of (average particle diameter±100 nm) account for preferably 70% by mass or more, and more preferably 80% by mass or more in the entire pigment. In addition, the particle size distribution of the secondary particles can be measured using a scattering intensity distribution.

The pigment is preferably an organic pigment. Examples of the organic pigment include the following pigments.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all of which are yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all of which are red pigments), C. I. Pigment Green 7, 10, 36, 37, 58, 59, and the like (all of which are green pigments), C. I. Pigment Violet 1, 19, 23, 27, 32, 37, 42, and the like (all of which are violet pigments), C. I. Pigment Blue 1, 2, 15, 15:1, 15:2, 15:3, 15:4, 15:6, 16, 22, 60, 64, 66, 79, 80, and the like (all of which are blue pigments).

These organic pigments can be used alone or in combination of two or more kinds thereof.

The dye is not particularly limited and known dyes can be used. For example, a dye such as a pyrazole azo-based dye, an anilino azo-based dye, a triarylmethane-based dye, an anthraquinone-based dye, an anthrapyridone-based dye, a benzylidene-based dye, an oxonol-based dye, a pyrazolotriazole azo-based dye, a pyridone azo-based dye, a cyanine-based dye, a phenothiazine-based dye, a pyrrolopyrazole azomethine-based dye, a xanthene-based dye, a phthalocyanine-based dye, a benzopyran-based dye, an indigo-based dye, or a pyrromethene-based dye can be used. In addition, a dimer of such a dye may be used. In addition, dyes described in JP2015-028144A and JP2015-034966A can also be used.

It is preferable that the light shielding material includes at least two or more selected from a red coloring agent, a blue coloring agent, a yellow coloring agent, a violet coloring agent, or a green coloring agent. That is, it is preferable that the light shielding material forms black by combination of at least two or more selected from a red coloring agent, a blue coloring agent, a yellow coloring agent, a violet coloring agent, or a green coloring agent. Preferred examples of the combination include the following aspects.

(1) An aspect in which the light shielding material contains a red coloring agent and a blue coloring agent.

(2) An aspect in which the light shielding material contains red coloring agent, a blue coloring agent, and a yellow coloring agent.

(3) An aspect in which the light shielding material contains a red coloring agent, a blue coloring agent, a yellow coloring agent, and a violet coloring agent.

(4) An aspect in which the light shielding material contains a red coloring agent, a blue coloring agent, a yellow coloring agent, a violet coloring agent, and a green coloring agent.

(5) An aspect in which the light shielding material contains a red coloring agent, a blue coloring agent, a yellow coloring agent, and a green coloring agent.

(6) An aspect in which the light shielding material contains a red coloring agent, a blue coloring agent, and a green coloring agent.

(7) An aspect in which the light shielding material contains a yellow coloring agent and a violet coloring agent.

In the above aspect (1), the mass ratio of the red coloring agent to the blue coloring agent in terms of red coloring agent:blue coloring agent is preferably 20 to 80:20 to 80, more preferably 20 to 60:40 to 80, and still more preferably 20 to 50:50 to 80.

In the above aspect (2), the mass ratio of the red coloring agent to the blue coloring agent to the yellow coloring agent in terms of red coloring agent:blue coloring agent:yellow coloring agent is preferably 10 to 80:20 to 80:10 to 40, more preferably 10 to 60:30 to 80:10 to 30, and still more preferably 10 to 40:40 to 80:10 to 20.

In the above aspect (3), the mass ratio of the red coloring agent to the blue coloring agent to the yellow coloring agent to the violet coloring agent in terms of red coloring agent: blue coloring agent:yellow coloring agent:violet coloring agent is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the above aspect (4), the mass ratio of the red coloring agent to the blue coloring agent to the yellow coloring agent to the violet coloring agent to the green coloring agent in terms of red coloring agent:blue coloring agent:yellow coloring agent:violet coloring agent:green coloring agent is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the above aspect (5), the mass ratio of the red coloring agent to the blue coloring agent to the yellow coloring agent to the green coloring agent in terms of red coloring agent: blue coloring agent:yellow coloring agent:green coloring agent is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the above aspect (6), the mass ratio of the red coloring agent to the blue coloring agent to the green coloring agent in terms of red coloring agent:blue coloring agent:green coloring agent is preferably 10 to 80:20 to 80:10 to 40, more preferably 10 to 60:30 to 80:10 to 30, and still more preferably 10 to 40:40 to 80:10 to 20.

In the above aspect (7), the mass ratio of the yellow coloring agent to the violet coloring agent in terms of yellow coloring agent:violet coloring agent is preferably 10 to 50:40 to 80, more preferably 20 to 40:50 to 70, and still more preferably 30 to 40:60 to 70.

As the yellow coloring agent, C. I. Pigment Yellow 139, 150, or 185 is preferable, C. I. Pigment Yellow 139 or 150 is more preferable, and C. I. Pigment Yellow 139 is still more preferable. As the blue coloring agent, C. I. Pigment Blue 15:6 is preferable. As the violet coloring agent, C. I. Pigment Violet 23 is preferable. As the red coloring agent, Pigment Red 122, 177, 224, or 254 is preferable, Pigment Red 122, 177, or 254 is more preferable, and Pigment Red 254 is still more preferable. As the green coloring agent, C. I. Pigment Green 7, 36, 58, or 59 is preferable.

(Organic Black Coloring Agent)

In the present invention, examples of the organic black coloring agent include a bisbenzofuranone compound, an azomethine compound, a perylene compound, and an azo-based compound, and the bisbenzofuranone compound or the perylene compound is preferable. Examples of the bisbenzofuranone compound include those described in JP2010-534726A, JP2012-515233A, and JP2012-515234A, and are available as, for example, "Irgaphor Black" manufactured by BASF Corporation. Examples of the perylene compound include C. I. Pigment Black 31 and 32. Examples of the azomethine compound include those described in JP1989-170601A (JP-H01-170601A), JP1990-034664A (JP-H02-034664A), and the like, and are available as, for example, "CHROMOFINE BLACK A1103" manufactured by Dainichiseika Color & Chemicals Mfg. Co., Ltd.

In the present invention, the bisbenzofuranone compounds are preferably compounds represented by the following formulae or a mixture thereof.

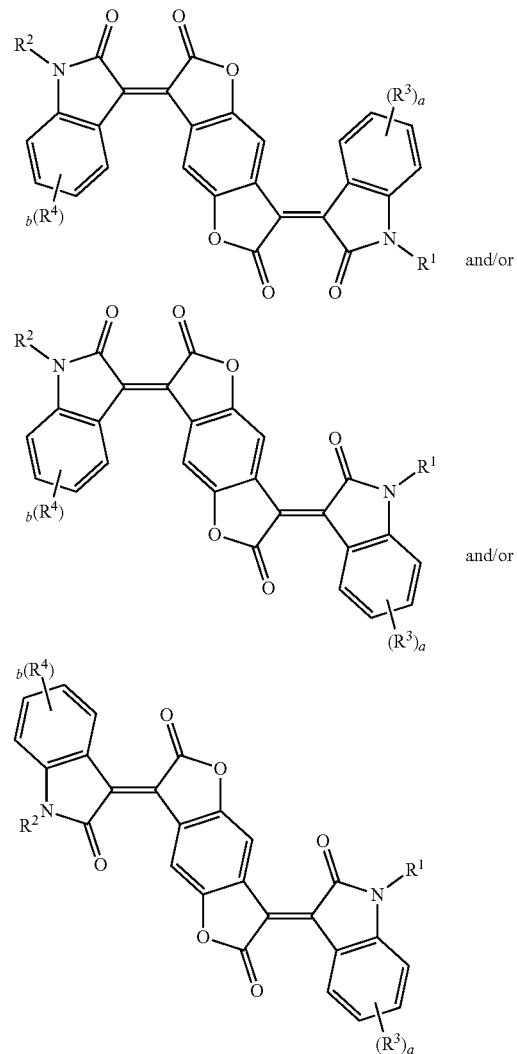

In the formula, $R^1$ and $R^2$ each independently represent a hydrogen atom or a substituent, $R^3$ and $R^4$ each independently represent a substituent, and a and b each independently represent an integer of 0 to 4; in a case where a is 2 or more, a plurality of $R^3$'s may be the same as or different from each other and the plurality of $R^3$'s may be bonded to each other to form a ring, in a case where b is 2 or more, a plurality of $R^4$'s may be the same as or different from each other and the plurality of $R^4$'s may be bonded to each other to form a ring.

The substituent represented by $R^1$ to $R^4$ represents a halogen atom, a cyano group, a nitro group, an alkyl group, an alkenyl group, alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $-NHCONR^{310}R^{311}$, $-NHCOOR^{312}$, $-SR^{313}$, $-SO_2R^{314}$, $-SO_2OR^{315}$, $-NHSO_2R^{316}$, or $-SO_2NR^{317}R^{318}$, and $R^{301}$ to $R^{318}$ each independently represent a hydrogen atom, an alkyl group, an alkenyl group, an alkynyl group, an aryl group, or a heteroaryl group.

With regard to the details of the bisbenzofuranone compounds, reference can be made to the description in paragraph Nos. 0014 to 0037 of JP2010-534726A, the contents of which are incorporated herein by reference.

In the present invention, in a case where an organic black coloring agent is used as the light shielding material, it is preferable that the organic black coloring agent is used in combination of a chromatic coloring agent. By using the organic black coloring agent in combination of the chromatic coloring agent, excellent spectral characteristics are likely to be obtained. Examples of the chromatic coloring agent which is used in combination with the organic black coloring agent include a red coloring agent, a blue coloring agent, and a violet coloring agent, and the red coloring agent or the blue coloring agent is preferable. These may be used alone or in combination of two or more kinds thereof. In addition, regarding a mixing ratio between the chromatic coloring agent and the organic black coloring agent, the amount of the organic black coloring agent is preferably 10 to 200 parts by mass, and more preferably 15 to 150 parts by mass, with respect to 100 parts by mass of the organic black coloring agent.

In the present invention, the content of the pigment in the light shielding material is preferably 95% by mass or more, more preferably 97% by mass or more, and still more preferably 99% by mass or more, with respect to the total mass of the light shielding material.

The content of the light shielding material in the composition for forming an infrared transmitting layer is preferably 5% to 50% by mass with respect to the total solid content of the composition for forming an infrared transmitting layer. The lower limit is preferably 9% by mass or more, and more preferably 13% by mass or more. The upper limit is preferably 40% by mass or less, and more preferably 30% by mass or less.

<<Near-Infrared Absorbing Dye>>

The composition for forming an infrared transmitting layer can further contain a near-infrared absorbing dye. In the composition for forming an infrared transmitting layer, the near-infrared absorbing dye plays a role to limit transmitted light (near-infrared rays) to a longer wavelength side. Examples of the near-infrared absorbing dye include a the near-infrared absorbing dyes that are used in the composition for forming a near-infrared cut layer as described above and preferred ranges thereof are also the same.

In a case where the composition for forming an infrared transmitting layer contains a near-infrared absorbing dye, the content of the near-infrared absorbing dye is preferably 1% to 30% by mass with respect to the total content of the composition for forming an infrared transmitting layer. The upper limit is preferably 20% by mass or less, and more preferably 10% by mass or less. The lower limit is preferably 3% by mass or more, and more preferably 5% by mass or more. Further, the total amount of the near-infrared absorbing dye and the light shielding material is preferably 10% to 70% by mass of the total content of the composition for forming an infrared transmitting layer. The lower limit is preferably 20% by mass or more, and more preferably 25% by mass or more. Further, the content of the near-infrared absorbing dye in the total amount of the near-infrared absorbing dye and the light shielding material is preferably 5% to 40% by mass. The upper limit is preferably 30% by mass or less, and more preferably 25% by mass or less. The lower limit is preferably 10% by mass or more, and more preferably 15% by mass or more.

<<Other Components>>

The composition for forming an infrared transmitting layer can further contain a polymerizable compound, a photopolymerization initiator, a resin, a solvent, a pigment derivative, a polymerization inhibitor, a surfactant, a silane coupling agent, an ultraviolet absorber, an antioxidant, or the like. With regard to the details of these, the above-mentioned materials that are used for the above-mentioned composition for forming a near-infrared cut layer may be mentioned, and preferred ranges thereof are also the same. Further, preferred contents of these materials are also the same as the contents of the composition for forming a near-infrared cut layer.

For example, in a case where a film is formed by coating, the viscosity (23° C.) of the composition for forming an infrared transmitting layer is preferably in a range of 1 to 3,000 mPa·s. The lower limit is preferably 3 mPa·s or more, and more preferably 5 mPa·s or more. The upper limit is preferably 2,000 mPa·s or less, and more preferably 1,000 mPa·s or less.

<Composition for Forming Colored Layer>

Next, the composition for forming a colored layer which can be preferably used for formation of a colored layer will be described. It is preferable that the composition for forming a colored layer includes a chromatic coloring agent. The chromatic coloring agent may be either a pigment or a dye. With regard to the details of the chromatic coloring agent, the above-mentioned ones may be mentioned. The content of the chromatic coloring agent is preferably 0.1% to 70% by mass with respect to the total solid content of the composition for forming a colored layer. The lower limit is preferably 0.5% by mass or more, and more preferably 1.0% by mass or more. The upper limit is preferably 60% by mass or less, and more preferably 50% by mass or less.

The composition for forming a colored layer can further contain a polymerizable compound, a photopolymerization initiator, a resin, a solvent, a pigment derivative, a polymerization inhibitor, a surfactant, a silane coupling agent, an ultraviolet absorber, an antioxidant, or the like. It is preferable that the composition includes at least a resin or a polymerizable compound, and it is more preferable that the composition includes at least a polymerizable compound, a photopolymerization initiator, and a resin. With regard to the details thereof, the above-mentioned materials which are used for the above-mentioned composition for forming a near-infrared cut layer may be mentioned, and preferred ranges thereof are also the same. Further, preferred contents of these materials are also the same as the content of the composition for forming a near-infrared cut layer.

For example, in a case where a film is formed by coating, the viscosity (23° C.) of the composition for forming a colored layer is preferably in a range of 1 to 3,000 mPa·s. The lower limit is preferably 3 mPa·s or more, and more preferably 5 mPa·s or more. The upper limit is preferably 2,000 mPa·s or less, and more preferably 1,000 mPa·s or less.

<Composition for Forming Ultraviolet Cut Layer>

Next, the composition for forming an ultraviolet cut layer which can be preferably used for formation of an ultraviolet cut layer will be described. It is preferable that the composition for forming an ultraviolet cut layer includes an ultraviolet absorber. Examples of the ultraviolet absorber include the ultraviolet absorbers described above to be used for the above-mentioned composition for forming a near-infrared cut layer. The content of the ultraviolet absorber is preferably 0.01% to 10% by mass, and more preferably 0.01% to 5% by mass, with respect to the total solid content of the composition for forming an ultraviolet absorber.

The composition for forming an ultraviolet cut layer can further contain a polymerizable compound, a photopolymerization initiator, a resin, a solvent, a polymerization inhibitor, a surfactant, a silane coupling agent, an antioxidant, or the like. It is preferable that the composition includes at least a resin or a polymerizable compound, and it is more preferable that the composition includes at least a polymerizable compound, a photopolymerization initiator, and a resin. With regard to the details thereof, the above-mentioned materials which are used for the above-mentioned composition for forming a near-infrared cut layer may be mentioned, and preferred ranges thereof are also the same. Further, preferred contents of these materials are also the same as the content of the composition for forming a near-infrared cut layer.

For example, in a case where a film is formed by coating, the viscosity (23° C.) of the composition for forming an ultraviolet cut layer is preferably in a range of 1 to 3,000 mPa·s. The lower limit is preferably 3 mPa·s or more, and more preferably 5 mPa·s or more. The upper limit is preferably 2,000 mPa·s or less, and more preferably 1,000 mPa·s or less.

<Composition for Forming Transparent Layer>

Next, the composition for forming a transparent layer which can be preferably used for formation of a transparent layer will be described.

<<Resin>>

It is preferable that the composition for forming a transparent layer contains a resin. Examples of the resin include the above-mentioned materials which are used for the above-mentioned composition for forming a near-infrared cut layer, and preferred ranges thereof are also the same. Further, a preferred content of the resin is also the same as the content of the composition for forming a near-infrared cut layer.

<<White Pigment>>

The composition for forming a transparent layer may contain a white or colorless pigment (hereinafter also referred to as a white pigment). Examples of the white pigment include particles of oxides including at least one element selected from Ti, Zr, Sn, Sb, Cu, Fe, Mn, Pb, Cd, As, Cr, Hg, Zn, Al, Mg, Si, P, or S. The shape of the white pigment is not particularly limited. Examples thereof include an isotropic shape (for example, a spherical shape and a polyhedral shape), an anisotropic shape (for example, a needle shape, a rod shape, and a plate shape), and an amorphous shape. The weight-average particle diameter of the primary particles of the white pigment is preferably 150 nm or less, more preferably 100 nm or less, and still more preferably 80 nm or less. The lower limit value is not particularly limited, but is preferably 1 nm or more. The specific surface area of the white pigment is preferably 10 to 400 $m^2/g$, more preferably 20 to 200 $m^2/g$, and still more preferably 30 to 150 $m^2/g$.

The content of the white pigment is preferably 20% to 70% by mass with respect to the total solid content of the composition for forming a transparent layer. The lower limit is more preferably 25% by mass or more, and still more preferably 30% by mass or more. The upper limit is more preferably 65% by mass or less, and still more preferably 60% by mass or less.

The composition for forming a transparent layer can further contain a polymerizable compound, a photopolymerization initiator, a solvent, a polymerization inhibitor, a surfactant, a silane coupling agent, an ultraviolet absorber, an antioxidant, or the like. With regard to the details thereof, the above-mentioned materials which are used for the above-mentioned composition for forming a near-infrared cut layer may be mentioned, and preferred ranges thereof are also the same. Further, preferred contents of these materials are also the same as the content of the composition for forming a near-infrared cut layer.

For example, in a case where a film is formed by coating, the viscosity (23° C.) of the composition for forming a transparent layer is preferably in a range of 1 to 3,000 mPa·s. The lower limit is preferably 3 mPa·s or more, and more preferably 5 mPa·s or more. The upper limit is preferably 2,000 mPa·s or less, and more preferably 1,000 mPa·s or less.

<Storage Container for Composition>

A storage container for each of the above-mentioned compositions is not particularly limited, and a known storage container can be used. Further, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or compositions. Examples of such a container include the containers described in JP2015-123351A.

<Method for Preparing Composition>

Each of the above-mentioned compositions can be prepared by mixing the above-mentioned components. In the preparation of the composition, all the components may be dissolved and/or dispersed at the same time in a solvent to prepare the composition, or the respective components may be appropriately left in two or more solutions or dispersion liquids and mixed to prepare the composition upon use (during coating), as desired.

Furthermore, in a case where the composition includes particles such as a pigment, it is preferable to include a process for dispersing the particles. In the process for dispersing the particles, examples of a mechanical force that is used for dispersion of the particles include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the particles in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the particles, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the particles, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that in the preparation of the composition, a composition for forming a near-infrared cut filter layer is filtered through a filter for the purpose of removing foreign matters, reducing defects, or the like. As the filter, any of filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. In a case where the filter has a pore diameter in the range, it can remove fine foreign matters reliably. In addition, it is also preferable to use a fibrous filter material. Examples of the fibrous filter material include a polypropylene fiber, a nylon fiber, and a glass fiber. Specific examples of the filter include filter cartridges of SBP type series (SBP008 and the like), TPR type series (TPR002, TPR005, and the like), or SHPX type series (SHPX003 and the like), manufactured by Roki Techno Co., Ltd.

In a case of using a filter, different filters (for example, a first filter and a second filter) may be combined. Here, the filtration with each of the filters may be performed once or may be performed twice or more times.

Furthermore, filters having different pore diameters within the above-mentioned range may be combined. With regard to the pore diameter of the filter herein, reference can be made to nominal values of filter manufacturers. A commercially available filter can be selected from, for example, various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, and the like.

As a second filter, a filter formed of the same material as that of the first filter, or the like can be used.

In addition, the filtration through the first filter may be performed with only a dispersion liquid, the other components may be mixed therewith, and then the filtration through the second filter may be performed.

<Optical Sensor>

The optical sensor of the embodiment of the present invention has the filter of the embodiment of the present invention. Examples of the optical sensor include a solid-state imaging element. Further, the solid-state imaging element of the embodiment of the present invention has the filter of the embodiment of the present invention. The configuration of the solid-state imaging element of the embodiment of the present invention is not particularly limited as long as the solid-state imaging element is configured to include the filter of the embodiment of the present invention and function as a solid-state imaging element. However, examples thereof include the following configuration.

The solid-state imaging element has a configuration in which a plurality of photodiodes including a light receiving area of a solid-state imaging element and a transfer electrode formed of polysilicon or the like is provided on a support, a light shielding film including tungsten and the like, having openings only over the light-receiving unit of the photodiode, is provided on the photodiodes and the transfer electrodes, a device protecting film including silicon nitride and the like, which is formed to cover the entire surface of the light shielding film and the light-receiving unit of the photodiodes, is provided on the light shielding film, and a color filter is provided on the device protecting film. Furthermore, the solid-state imaging element may have a configuration in which a light collecting means (for example, a microlens, the same applies hereinafter) is disposed under the filter of the embodiment of the present invention (a side closer to the support) or on the filter of the embodiment of the present invention, on the device protecting film.

Figure 8:
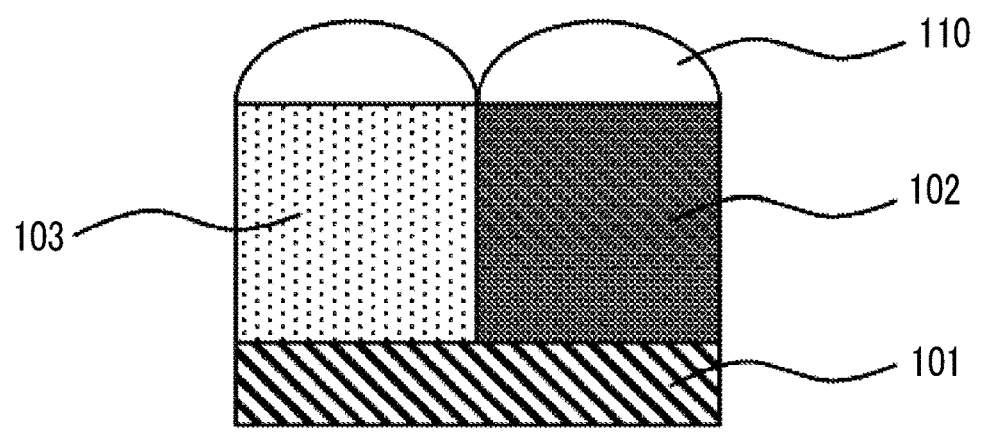
FIG. 8 is a schematic view showing one embodiment of the optical sensor.

One embodiment of the optical sensor using the filter of the embodiment of the present invention will be described. In FIG. 8, Reference 101 is a solid-state imaging element. The imaging region provided on the solid-state imaging element 101 has a pixel 102 of an infrared transmitting filter and a pixel 103 of an infrared transmitting filter. Further, a microlens 110 is arranged on the pixels 102 and 103.

Figure 9:
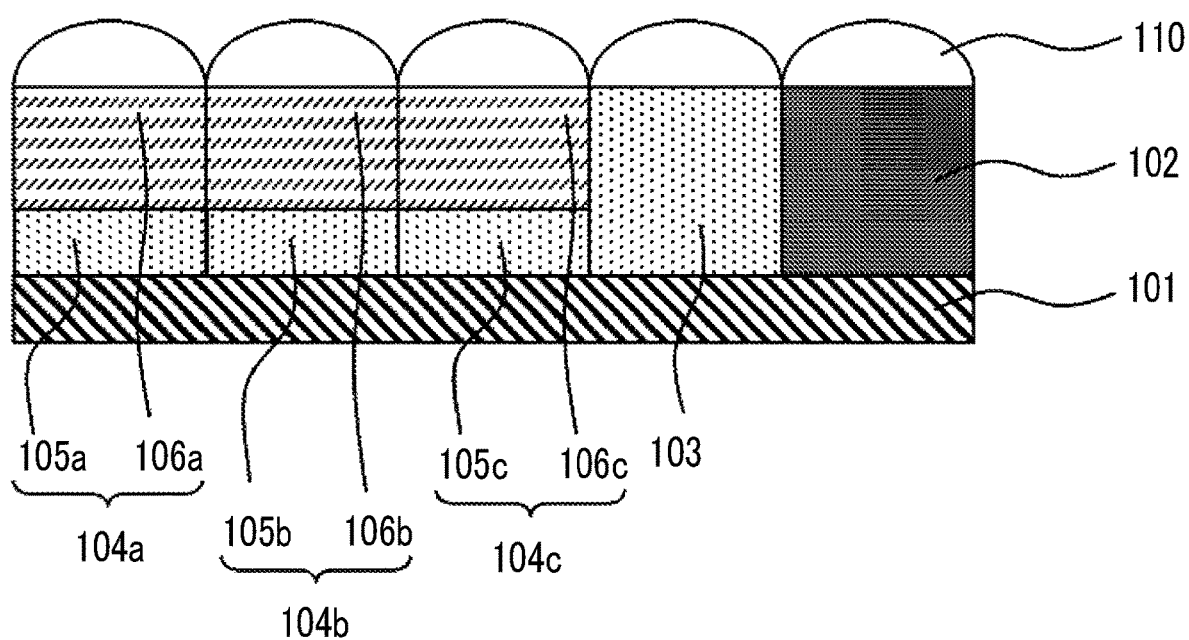
FIG. 9 is a schematic view showing another embodiment of the optical sensor.

FIG. 9 is another embodiment of an optical sensor including the filter of the embodiment of the present invention. The optical sensor in FIG. 9 has an imaging region provided on the solid-state imaging element 101, in which each of a pixel 102 of an infrared transmitting filter, a pixel 103 of a near-infrared cut filter, and colored pixels 104a, 104b, and 104c. Further, a microlens 110 is arranged on each of the pixel 102 of the infrared transmitting filter, the pixel 103 of the near-infrared cut filter, and the colored pixels 104a, 104b, and 104c. In FIG. 9, the colored pixel 104a is constituted with a laminate of a near-infrared cut layer 105a and a colored layer 106a. Further, the colored pixel 104b is constituted with a laminate of a near-infrared cut layer 105b and a colored layer 106b. In addition, the colored pixel 104c is constituted with a laminate of a near-infrared cut layer 105c and a colored layer 106c.

<Image Display Device>

The filter of the embodiment of the present invention can also be used for an image display device such as a liquid crystal display device and an organic electroluminescence (organic EL) display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention is applicable is not particularly limited, and can be applied to, for example, liquid crystal display devices employing various systems described in the "Liquid Crystal Display Technology for Next Generation".

The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum light emission peaks in a blue range (430 nm to 485 nm), a green range (530 nm to 580 nm), and a yellow range (580 nm to 620 nm). It is more preferable that the spectrum has a maximum light emission peak in a red range (650 nm to 700 nm), in addition to such light emission peaks.

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention is not limited to the specific Examples shown below. In addition, "parts" and "%" are on a mass basis unless otherwise specified. Incidentally, in structural formulae, Me represents a methyl group, Et represents an ethyl group, and Ph represents a phenyl group.

[Preparation of Pigment Dispersion Liquid A-1]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid A-1.

Pigment 1 and derivative 1 (pigment 1:derivative 1=5:2 (mass ratio)) . . . 7.5 parts by mass
Dispersant 1 . . . 6.0 parts by mass
Propylene glycol methyl ether acetate (PGMEA) . . . 86.5 parts by mass

[Preparation of Pigment Dispersion Liquids A-2 and A-3]

Pigment dispersion liquids A-2 and A-3 were each prepared under the same conditions as above, except that pigments 2 and 3 were used instead of the pigment 1 used for the pigment dispersion liquid A-1.

[Preparation of Pigment Dispersion Liquid A-4]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid A-4.

Pigment 4 and derivative 2 (pigment 4:derivative 2=10:3 (mass ratio)) . . . 7.5 parts by mass
Dispersant 1 . . . 6.0 parts by mass
Propylene glycol methyl ether acetate (PGMEA) . . . 86.5 parts by mass

[Preparation of Pigment Dispersion Liquid B-1]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-1.

A mixed pigment (red pigment:yellow pigment=7:3 (mass ratio)) including a red pigment (C. I. Pigment Red 254) and a yellow pigment (C. I. Pigment Yellow 139) . . . 18.0 parts by mass
Dispersant 1 . . . 8.1 parts by mass
PGMEA . . . 73.1 parts by mass

[Preparation of Pigment Dispersion Liquid B-2]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-2.

A pigment (blue pigment:violet pigment=4:1 (mass ratio)) including a blue pigment (C. I. Pigment Blue 15:6) and a violet pigment (C. I. Pigment Violet 23) . . . 18.0 parts by mass
Dispersant 1 . . . 3.1 parts by mass
Alkali-soluble resin 2 . . . 5.0 parts by mass
Cyclohexanone . . . 31.2 parts by mass
PGMEA . . . 42.7 parts by mass

[Preparation of Pigment Dispersion Liquid B-3]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-3.

Violet pigment (C. I. Pigment Violet 23) . . . 16.0 parts by mass
Dispersant 1 . . . 13.0 parts by mass
Cyclohexanone . . . 20.0 parts by mass
PGMEA . . . 51.0 parts by mass

[Preparation of Pigment Dispersion Liquid B-4]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-4.

Yellow pigment (C. I. Pigment Yellow 139) . . . 14.0 parts by mass
Dispersant 1 . . . 9.3 parts by mass
Cyclohexanone . . . 17.0 parts by mass
PGMEA . . . 59.7 parts by mass

[Preparation of Pigment Dispersion Liquid B-5]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-5.

A mixed pigment (black pigment:blue pigment:yellow pigment=3:1:1 (mass ratio)) including a black pigment (C. I. Pigment Black 32), a blue pigment (C. I. Pigment Blue 15:6), and a yellow pigment (C. I. Pigment Yellow 139) . . . 10.0 parts by mass
Dispersant 1 . . . 5.0 parts by mass
PGMEA . . . 85.0 parts by mass

[Preparation of Pigment Dispersion Liquid B-6]

A mixed liquid having the following composition was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment dispersion liquid B-6.

A mixed pigment (green pigment:yellow pigment=6:5 (mass ratio)) including a green pigment (C. I. Pigment Green 36) and yellow pigment (C. I. Pigment Yellow 150 . . . 11.7 parts by mass
Dispersant 1 . . . 6.3 parts by mass
PGMEA . . . 83.0 parts by mass

[Preparation of Composition for Forming Near-Infrared Cut Layer]

The raw materials described in the following table were mixed to prepare compositions 101 to 108. The numerical values described in the following table are parts by mass. Further, a pixel formed using the composition 101 had a maximum absorption wavelength in a wavelength range of 700 to 2,000 nm, and an absorbance Amax/absorbance A550 which is a ratio of the absorbance Amax at a maximum absorption wavelength to the absorbance A550 at a wavelength of 550 nm of 82. In addition, the pixels formed using the compositions 102 to 108 had a maximum absorption wavelength in a wavelength range of 700 to 2,000 nm, and an absorbance Amax/absorbance A550 which is a ratio of the absorbance Amax at a maximum absorption wavelength to the absorbance A550 at a wavelength of 550 nm of 20 to 500.

TABLE 1

| | Composition 101 | Composition 102 | Composition 103 | Composition 104 | Composition 105 | Composition 106 | Composition 107 | Composition 108 |
|---|---|---|---|---|---|---|---|---|
| Pigment dispersion liquid A-1 | 38.8 | | | | | | | 57.3 |
| Pigment dispersion liquid A-2 | | 38.8 | | | | | | |
| Pigment dispersion liquid A-3 | | | 38.8 | | | | | |
| Pigment dispersion liquid A-4 | | | | 38.8 | | | | |
| Dye 1 | | | | | 2.4 | | | |
| Dye 2 | | | | | | 0.006 | | |
| Dye 3 | | | | | | 0.010 | | |
| Dye 4 | | | | | | 0.006 | | |
| Dye 5 | | | | | | | 0.8 | |
| Alkali-soluble resin 1 | 4.2 | 4.2 | 4.2 | 4.2 | 9.0 | 10.5 | 10.0 | 1.7 |
| Polymerizable compound 1 | | | | | 1.7 | 2.0 | 1.9 | |
| Polymerizable compound 2 | 4.2 | 4.2 | 4.2 | 4.2 | | | | 2.0 |
| Polymerizable compound 3 | 4.2 | 4.2 | 4.2 | 4.2 | | | | 2.0 |
| Photopolymerization initiator 1 | 0.9 | 0.9 | 0.9 | 0.9 | 1.9 | 2.2 | 2.1 | 0.4 |
| Surfactant 1 | 0.03 | 0.03 | 0.03 | 0.03 | | | | 0.03 |
| Surfactant 2 | | | | | 2.0 | 2.3 | 2.2 | |
| Ultraviolet absorber 1 | 1.6 | 1.6 | 1.6 | 1.6 | | | | 1.2 |
| Antioxidant 1 | 0.2 | 0.2 | 0.2 | 0.2 | | | | 0.2 |
| Antioxidant 2 | 0.005 | 0.005 | 0.005 | 0.005 | 0.001 | 0.001 | 0.001 | 0.002 |
| Organic solvent 1 | 45.9 | 45.9 | 45.9 | 45.9 | 83.0 | 83.0 | 83.0 | 35.2 |

[Preparation of Composition for Forming Infrared Transmitting Layer]

The raw materials described in the following table were mixed to prepare compositions 201 to 205. The numerical values described in the following table are parts by mass.

TABLE 2

| | Composition 201 | Composition 202 | Composition 203 | Composition 204 | Composition 205 |
|---|---|---|---|---|---|
| Pigment dispersion liquid B-1 | 30.9 | 32.1 | | | 30.9 |
| Pigment dispersion liquid B-2 | 26.5 | 21.3 | | | 26.5 |
| Pigment dispersion liquid B-3 | | | 32.8 | | |
| Pigment dispersion liquid B-4 | | | 19.8 | | |
| Pigment dispersion liquid B-5 | | | | 68.5 | |
| Pigment dispersion liquid A-1 | | 28.5 | | | |
| Alkali-soluble resin 2 | 2.2 | 0.6 | | 2.2 | 2.2 |
| Alkali-soluble resin 3 | | | 0.2 | | |
| Epoxy resin 1 | | 0.6 | | | |
| Polymerizable compound 1 | 0.6 | | | 0.6 | 0.6 |
| Polymerizable compound 4 | 1.4 | | 3.8 | 1.4 | |
| Polymerizable compound 2 | | 3.9 | | | |
| Polymerizable compound 6 | | | | | 1.4 |
| Photopolymerization initiator 2 | | 1 | | | 1 |
| Photopolymerization initiator 1 | 1 | | | 1 | |

TABLE 2-continued

|  | Composition 201 | Composition 202 | Composition 203 | Composition 204 | Composition 205 |
|---|---|---|---|---|---|
| Photopolymerization initiator 3 |  |  | 1.1 |  |  |
| Silane coupling agent 1 | 0.5 |  |  | 0.5 | 0.5 |
| Ultraviolet absorber 2 |  |  | 0.6 |  |  |
| Surfactant 1 | 0.05 | 0.05 | 0.05 | 0.05 | 0.05 |
| Surfactant 3 |  |  | 0.2 |  |  |
| Organic solvent 1 | 36.9 | 12.0 | 41.5 | 25.8 | 36.9 |

[Preparation of Composition for Forming Colored Layer]

The raw materials described in the following table were mixed to prepare compositions 301 to 303. The numerical values described in the following table are parts by mass.

TABLE 3

|  | Composition 301 | Composition 302 | Composition 303 |
|---|---|---|---|
| Pigment dispersion liquid B-1 | 33.3 |  |  |
| Pigment dispersion liquid B-2 |  |  | 32.2 |
| Pigment dispersion liquid B-6 |  | 73.73 |  |
| Alkali-soluble resin 2 | 0.6 | 0.3 | 0.8 |
| Polymerizable compound 4 | 0.6 |  | 0.7 |
| Polymerizable compound 7 |  | 0.8 | 1.5 |
| Polymerizable compound 8 |  | 0.4 |  |
| Photopolymerization initiator 1 | 0.3 | 0.6 | 0.7 |
| Photopolymerization initiator 4 |  |  | 0.1 |
| Ultraviolet absorber 2 |  | 0.5 |  |
| Surfactant 1 | 0.04 | 0.04 |  |
| Organic solvent 1 | 65.2 | 23.6 | 64.0 |

The raw materials included in each of the pigment dispersion liquids and the raw materials described in the respective tables are as follows.

(Pigment)

Pigments 1 to 4: Compounds 1 to 4 having the following structures

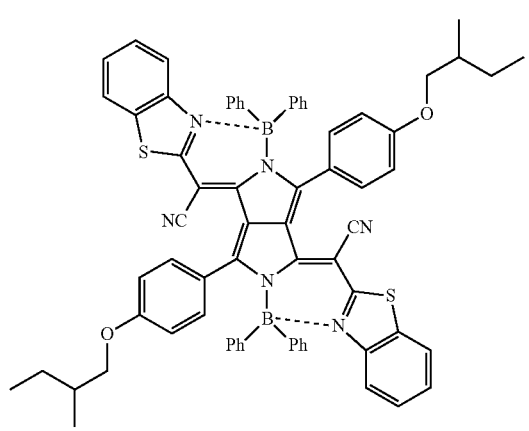

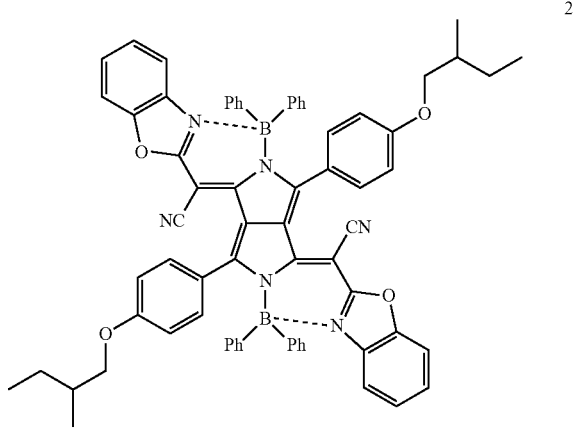

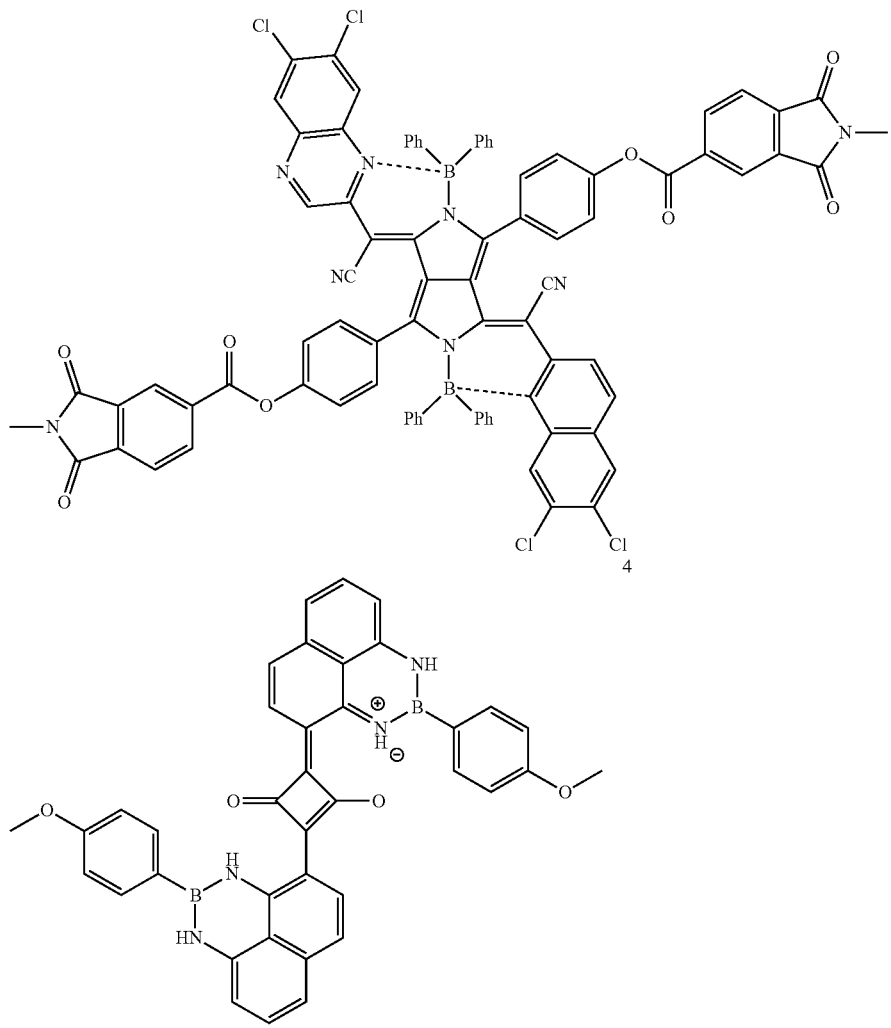
(Dye)
Dyes 1 to 4: Compounds 1 to 4 having the following structures
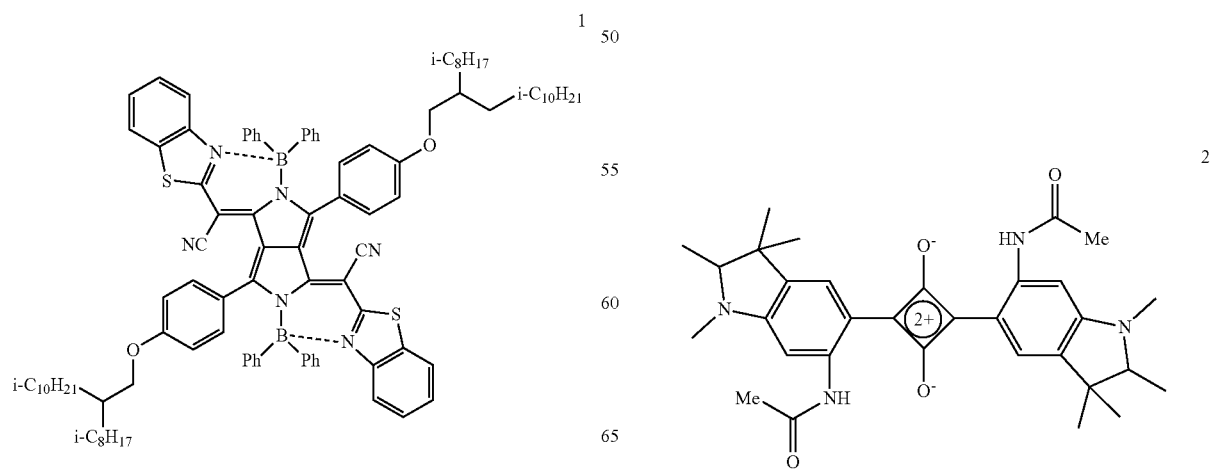

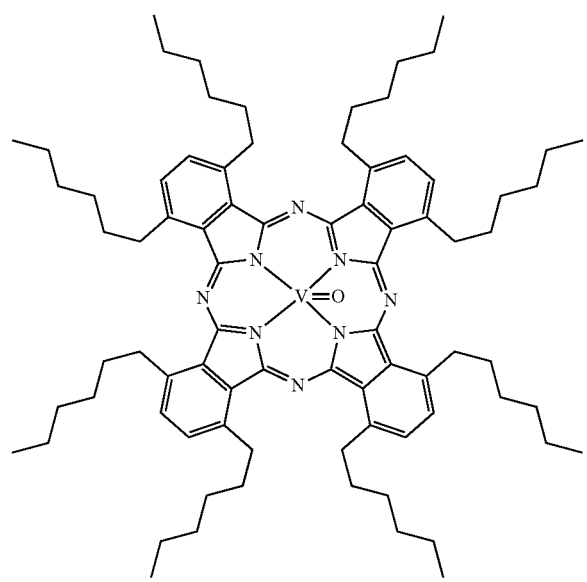
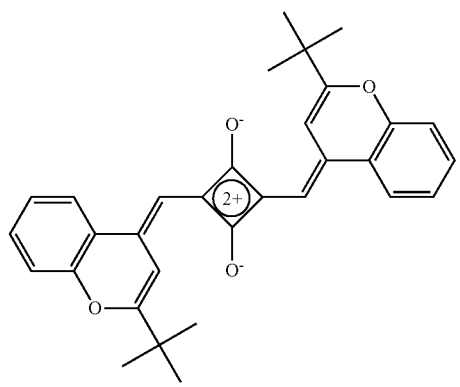
Dye 5: NK-5060 (cyanine compound, manufactured by Hayashibara Co., Ltd.)
(Derivative)
Derivatives 1 and 2: Compounds 1 and 2 having the following structures
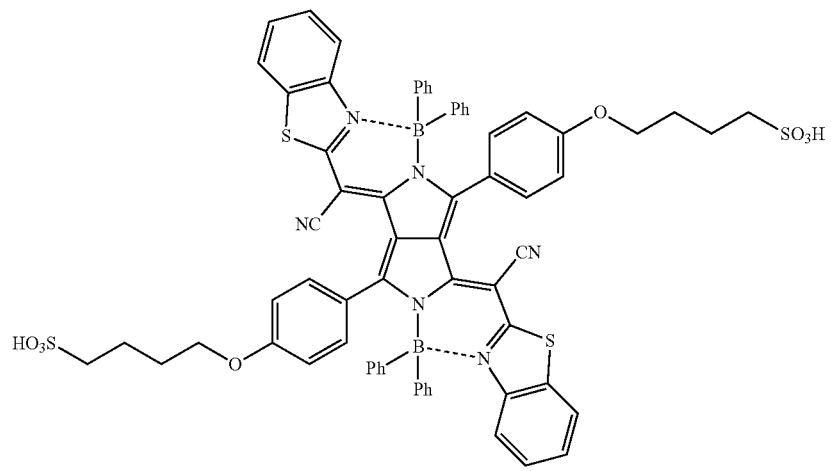
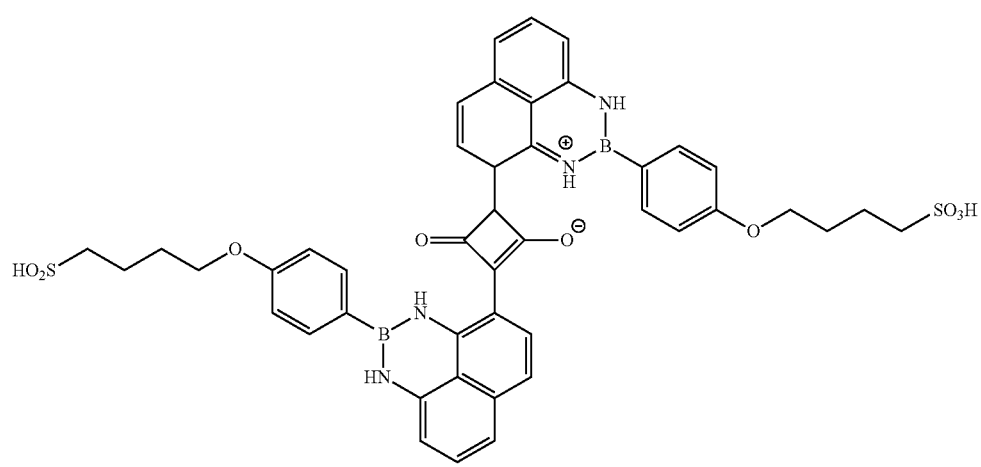

(Polymerizable Compound)

Polymerizable compound 1: Mixture of compounds having the following structures (a mixture having the left compound and the right compound at a molar ratio of 7:3)

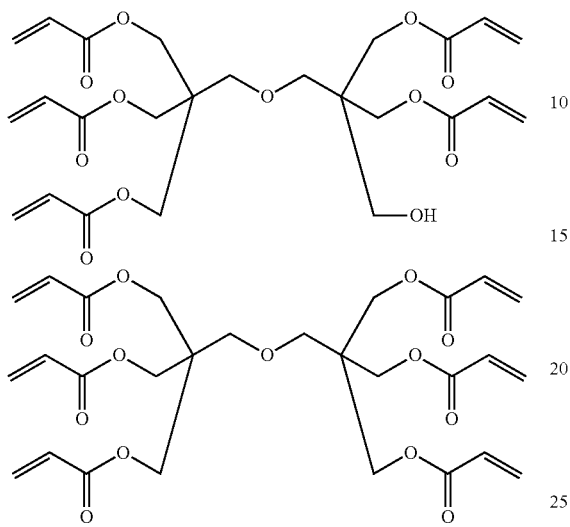

Polymerizable compound 2: Compound having the following structure

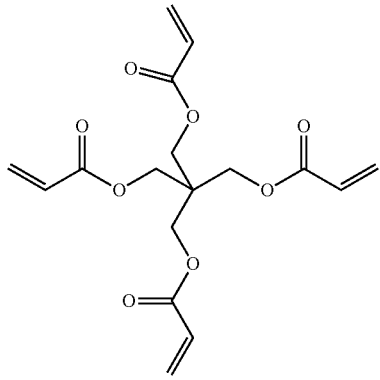 [SMILES: C=CC(=O)OCC(COC(=O)C=C)(COC(=O)C=C)COC(=O)C=C]

Polymerizable compound 3: Mixture of compounds having the following structures (height ratios in high performance liquid chromatography of the left compound:the middle compound:the right compound of 46.15:49.39:4.46)

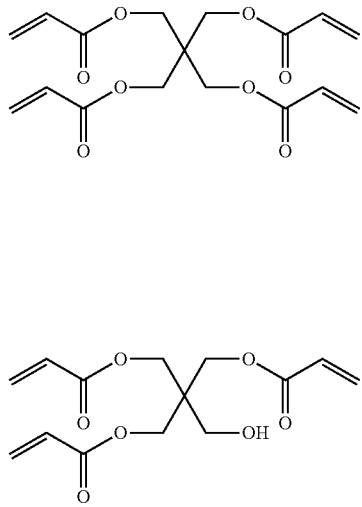

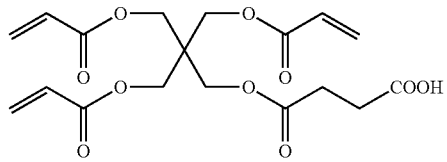

Polymerizable compound 4: Compound having the following structure

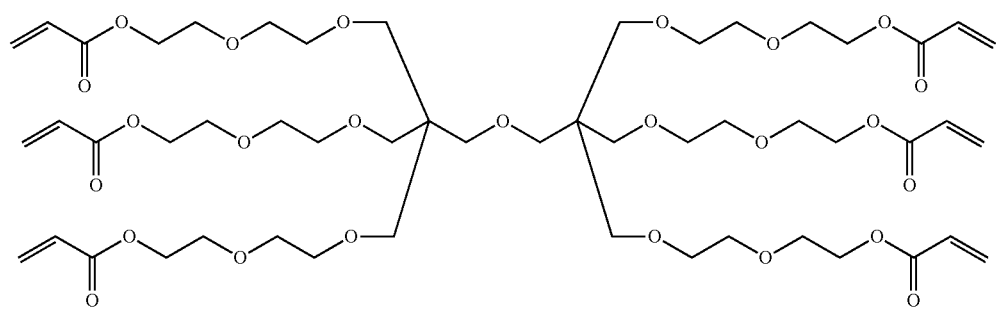 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 6: Compound having the following structure

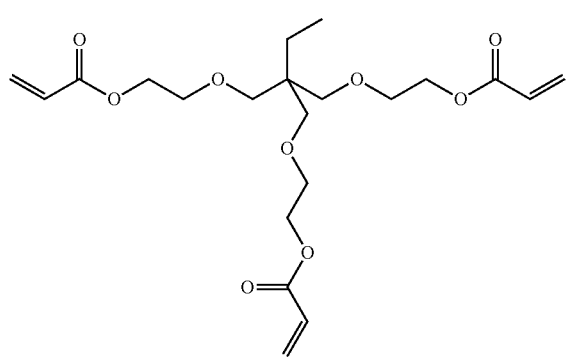 [SMILES: C=CC(=O)OCCOCC(CC)(COCCOC(=O)C=C)COCCOC(=O)C=C]

Polymerizable compound 7: ARONIX TO-2349 (manufactured by Toagosei Chemical Industry Co., Ltd.)

Polymerizable compound 8: NK OLIGO UA-7200 (manufactured by Shin-Nakamura Chemical Co., Ltd.)

(Dispersant)

Dispersant 1: Resin having the following structure (Mw=21,000, the numerical values shown together with the main chain are the numbers of moles, and the numerical values shown together with a side chain are the numbers of the repeating units)

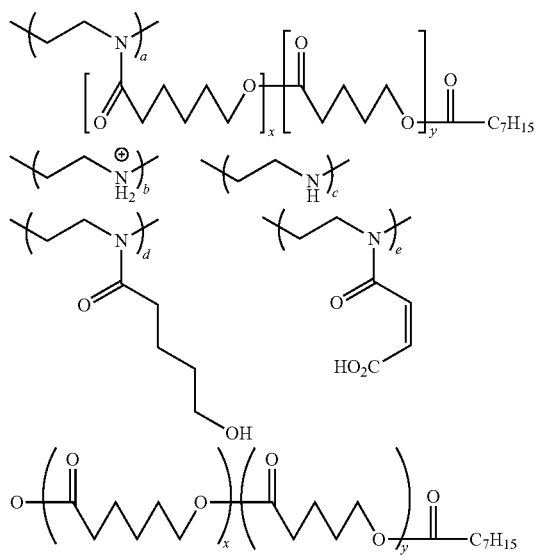

a/b/c/d/e = 36/4/25/1/24 (mol %)
x = 48 y = 12

(Alkali-Soluble Resin)

Alkali-soluble resin 1: Resin having the following structure 1 (Mw=41,000, the numerical values shown together with the main chain are numbers of moles)

Alkali-soluble resin 2: Resin having the following structure 2 (Mw=11,000, the numerical values shown together with the main chain are numbers of moles)

Alkali-soluble resin 3: Resin having the following structure 3 (Mw=14,000, the numerical values shown together with the main chain are numbers of moles)

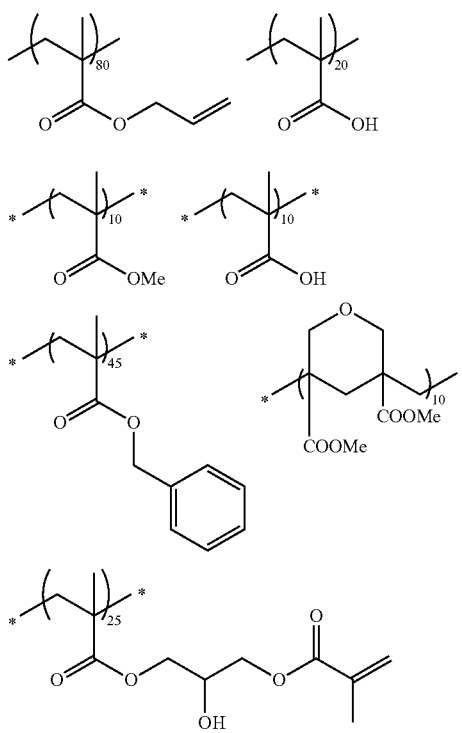

(Epoxy Resin)

Epoxy resin 1: EPICLON N-695 (manufactured by DIC Corporation)

(Photopolymerization Initiator)

Photopolymerization initiators 1 to 4: Compounds 1 to 4 having the following structures

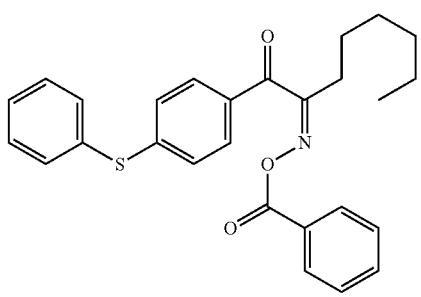

2

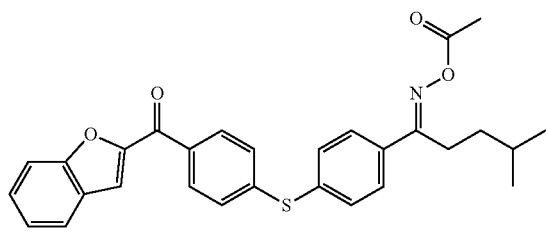

3

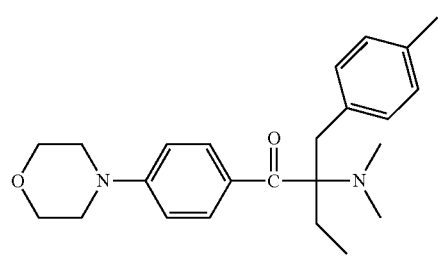

4

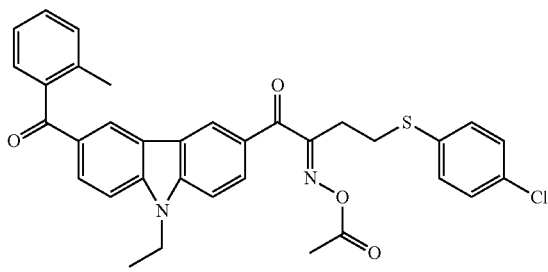

(Silane Coupling Agent)

Silane coupling agent 1: Compound having the following structure

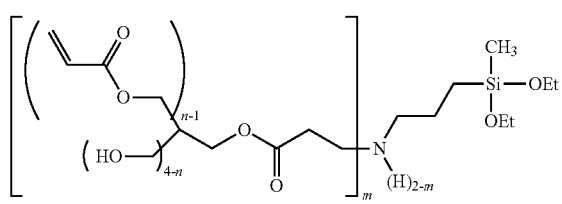

n = 4, 3, 2
(n = 4 main reactant)

m = 2 or 1
(m = 2 main product)

(Ultraviolet Absorber)

Ultraviolet absorbers 1 and 2: Compounds 1 and 2 having the following structures

1

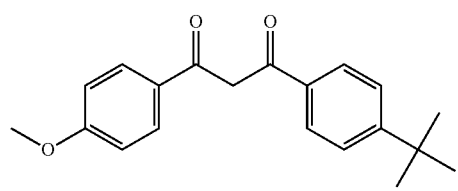

2

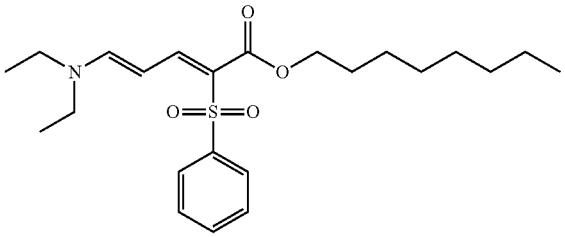

Ultraviolet absorber 3: TINUVIN 400 (manufactured by BASF)

(Antioxidant)

Antioxidants 1 and 2: Compounds 1 and 2 having the following structures

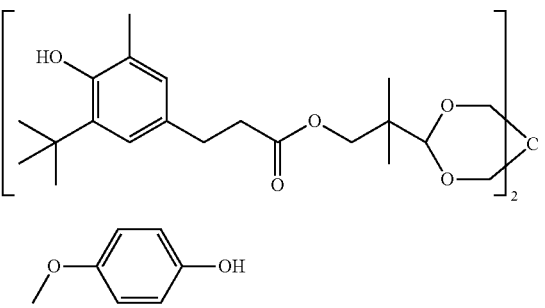

(Surfactant)

Surfactant 1: The following mixture (Mw=14,000, in the following formulae, % representing the ratio of the repeating units is % by mass)

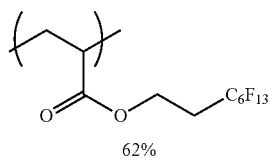

62%

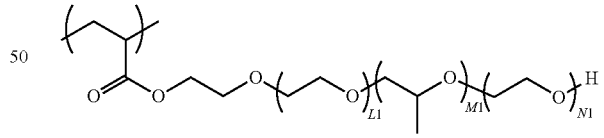

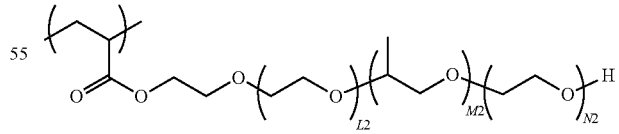

38%

L1 + N1 + L2 + N2 = 14
M1 + M2 = 17

Surfactant 2: MEGAFACE RS-72-K (manufactured by DIC Corporation)

Surfactant 3: PIONIN D6112W (manufactured by Takemoto Oil & Fat Co., Ltd.)

(Organic Solvent)

Organic solvent 1: Propylene glycol methyl ether acetate (PGMEA)

<Composition for Forming Ultraviolet Cut Layer>

The following raw materials were mixed to prepare a composition for forming an ultraviolet cut layer (composition 401).

Alkali-soluble resin 2: 11.0 parts by mass
Polymerizable compound 1: 1.7 parts by mass
Photopolymerization initiator 1: 1.9 parts by mass
Ultraviolet absorber 3: 2.4 parts by mass
Surfactant 1: 0.1 parts by mass
Antioxidant 2: 0.02 parts by mass
Organic solvent 1: 83 parts by mass <Preparation of Composition for Forming Transparent Layer>

The following raw materials were mixed to prepare a composition for forming a transparent layer (composition 402).

Alkali-soluble resin 1: 14.8 parts by mass
Polymerizable compound 2: 14.8 parts by mass
Polymerizable compound 3: 14.8 parts by mass
Photopolymerization initiator 1: 3.2 parts by mass
Ultraviolet absorber 1: 5.7 parts by mass
Surfactant 1: 0.1 parts by mass
Antioxidant 1: 0.7 parts by mass
Antioxidant 2: 0.02 parts by mass
Organic solvent 1: 45.9 parts by mass <Production of Filter>

Example 1

Using the composition 101, pixels (pixels of a near-infrared cut filter, a film thickness of 1.0 μm) of a pattern in the shape of a 1.1×1.1 μm island bayer were formed on a silicon substrate by lithography. Next, using the composition 201, pixels (pixels of an infrared transmitting filter, a film thickness of 1.0 μm) of a pattern in the shape of a 1.1×1.1 μm island bayer were formed on the silicon substrate having the pixel of the near-infrared cut filter formed thereon by lithography, and thus, a filter shown in FIG. 1 was produced. In a filter of Example 1, in FIG. 1, the pixels 11 and 14 are each a pixel of the near-infrared cut filter, and the pixels 12 and 13 are each a pixel of the infrared transmitting filter. In addition, the height difference between the top surfaces of the respective pixels was 0.1 μM or less.

Examples 2 to 11

In the same manner as in Example 1 except that a composition described in the following table was used as the composition used for formation of each of the pixels, a filter shown in FIG. 1 was produced. The height difference between the top surfaces of the respective pixels was 0.1 μm or less.

Example 12

Using the composition 105, pixels (pixels of a near-infrared cut filter, a film thickness of 1.0 μm) of a pattern in the shape of a 1.1×1.1 μm island bayer were formed on a silicon substrate by a dry etching method. Next, using the composition 201, pixels (pixels of an infrared transmitting filter, a film thickness of 1.0 μm) of a pattern in the shape of a 1.1×1.1 μm island bayer were formed on the silicon substrate having the pixel of the near-infrared cut filter formed thereon by lithography, and thus, a filter shown in FIG. 1 was produced. In a filter of Example 12, in FIG. 1, the pixels 11 and 14 are each a pixel of the near-infrared cut filter, and the pixels 12 and 13 are each a pixel of the infrared transmitting filter. In addition, the height difference between the top surfaces of the respective pixels was 0.1 μm or less.

Examples 13 and 14

In the same manner as in Example 12 except that a composition described in the following table was used as the composition used for formation of each of the pixels, a filter shown in FIG. 1 was produced. The height difference between the top surfaces of the respective pixels was 0.1 μm or less.

TABLE 4

| | Example 1 | Example 2 | Example 3 | Example 4 | Example 5 | Example 6 | Example 7 |
|---|---|---|---|---|---|---|---|
| Composition 101 | Pixel 11, pixel 14 | Pixel 11, pixel 14 | Pixel 11, pixel 14 | Pixel 11, pixel 14 | | | |
| Composition 102 | | | | | Pixel 11, pixel 14 | | |
| Composition 103 | | | | | | Pixel 11, pixel 14 | Pixel 11, pixel 14 |
| Composition 104 | | | | | | | |
| Composition 105 | | | | | | | |
| Composition 106 | | | | | | | |
| Composition 107 | | | | | | | |
| Composition 201 | Pixel 12, pixel 13 | | | | | Pixel 12, pixel 13 | |
| Composition 202 | | | | | | | Pixel 12, pixel 13 |
| Composition 203 | | Pixel 12, pixel 13 | | | Pixel 12, pixel 13 | | |
| Composition 204 | | | Pixel 12, pixel 13 | | | | |
| Composition 205 | | | | Pixel 12, pixel 13 | | | |

TABLE 5

|  | Example 8 | Example 9 | Example 10 | Example 11 | Example 12 | Example 13 | Example 14 |
|---|---|---|---|---|---|---|---|
| Composition 101 | | | | | | | |
| Composition 102 | | | | | | | |
| Composition 103 | Pixel 11, pixel 14 | Pixel 11, pixel 14 | Pixel 11, pixel 14 | | | | |
| Composition 104 | | | | Pixel 11, pixel 14 | | | |
| Composition 105 | | | | | Pixel 11, pixel 14 | | |
| Composition 106 | | | | | | Pixel 11, pixel 14 | |
| Composition 107 | | | | | | | Pixel 11, pixel 14 |
| Composition 201 | | | | Pixel 12, pixel 13 | Pixel 12, pixel 13 | Pixel 12, pixel 13 | Pixel 12, pixel 13 |
| Composition 202 | | | | | | | |
| Composition 203 | Pixel 12, pixel 13 | | | | | | |
| Composition 204 | | Pixel 12, pixel 13 | | | | | |
| Composition 205 | | | Pixel 12, pixel 13 | | | | |

By incorporation of the filters of Examples 1 to 14 into solid-state imaging elements, the solid-state imaging elements could take an image having high sensitivity and high resolution with less noise by shielding light in the infrared wavelength range, and simultaneously, infrared light could be detected with high accuracy while not being affected by noise and the like caused by visible light. In addition, ambient light with less noise could be detected.

In Examples 1 to 14, the same effects as those in each of Examples were obtained in any of cases where the ratio of the area of the pixel of the near-infrared cut filter is set to be larger or smaller than the ratio of the area of the pixels of the infrared transmitting filter by changing the ratio of the area of the pixel of the near-infrared cut filter to the area of the pixel of the infrared transmitting filter.

Example 20

Using the composition 101, pixels (pixels of a first near-infrared cut filter, a film thickness of 1.0 μm) of a pattern in the shape of a 1.1×1.1 μm island bayer were formed on a silicon substrate by lithography. Next, using the composition 102, pixels (pixels of a second infrared transmitting filter, a film thickness of 1.0 μm) of a pattern in the shape of a 1.1×1.1 μm island bayer were formed on the silicon substrate having the pixels of the first near-infrared cut filter formed thereon by lithography, and thus, a filter shown in FIG. 1 was produced. In a filter of Example 20, in FIG. 1, the pixels 11 and 14 are each a pixel of the first near-infrared cut filter, and the pixels 12 and 13 are each a pixel of the second infrared transmitting filter. The pixel of the first near-infrared cut filter and the pixel of the second near-infrared cut filter are the pixels of the near-infrared cut filter that shield different light at a wavelength in the infrared region. In addition, the height difference between the top surfaces of the respective pixels was 0.1 μm or less.

Examples 21, 25, and 26

In the same manner as in Example 20 except that a composition described in the following table was used as the composition used for formation of each of the pixels, a filter shown in FIG. 1 was produced. The height difference between the top surfaces of the respective pixels was 0.1 μm or less.

Example 22

Using the composition 105, pixels (pixels of a first near-infrared cut filter, a film thickness of 1.0 μm) of a pattern in the shape of a 1.1×1.1 μm island bayer were formed on a silicon substrate by lithography. Next, using the composition 102, pixels (pixels of a second infrared transmitting filter, a film thickness of 1.0 μm) of a pattern in the shape of a 1.1 μm×1.1 μm island bayer were formed on the silicon substrate having the pixels of the first near-infrared cut filter formed thereon by lithography, and thus, a filter shown in FIG. 1 was produced. In a filter of Example 22, in FIG. 1, the pixels 11 and 14 are the pixels of the first near-infrared cut filter, and the pixels 12 and 13 are the pixels of the second infrared transmitting filter. The pixels of the first near-infrared cut filter and the pixels of the second near-infrared cut filter are each pixels of the near-infrared cut filter that shield different light at a wavelength in the infrared region. In addition, the height difference between the top surfaces of the respective pixels was 0.1 μm or less.

Examples 23, 24, and 27 to 29

In the same manner as in Example 20 except that a composition described in the following table was used as the composition used for formation of each of the pixels, a filter shown in FIG. 1 was produced. The height difference between the top surfaces of the respective pixels was 0.1 μm or less.

Example 30

Using the composition 101, pixels (pixels of a first near-infrared cut filter, a film thickness of 1.0 μm) of a pattern in the shape of a 1.1 μm×1.1 μm island bayer were formed on a silicon substrate by lithography. Next, using the composition 102, pixels (pixels of a second infrared transmitting filter, a film thickness of 1.0 μm) of a pattern in the shape of a 1.1 μm×1.1 μm island bayer were formed on the silicon substrate having the pixels of the first near-infrared cut filter formed thereon by lithography. Next, using the composition 103, pixels (pixels of a third infrared transmitting filter, a film thickness of 1.0 μm) of a pattern in the shape of a 1.1 μm×1.1 μm island bayer were formed on the silicon substrate having the pixels of the first near-infrared cut filter and the pixels of the second near-infrared cut filter formed thereon by lithography, and thus, a filter shown in FIG. 3 was produced. In a filter of Example 30, in FIG. 3, the pixel 21 is a pixel of the first near-infrared cut filter, the pixel 22 is a pixel of the second near-infrared cut filter, and the pixel 23 is a pixel of the third near-infrared cut filter. The pixel of the first near-infrared cut filter, the pixel of the second near-infrared cut filter, and the pixel of the third near-infrared cut filter are each a pixel of a near-infrared cut filter that shields each different light at a wavelength in the infrared region. In addition, the height difference between the top surfaces of the respective pixels was 0.1 μm or less.

Example 31

In the same manner as in Example 30 except that a composition described in the following table was used as the composition used for formation of each of the pixels, a filter shown in FIG. 1 was produced. The height difference between the top surfaces of the respective pixels was 0.1 μm or less.

Example 32

Using the composition 105, pixels (pixels of a first near-infrared cut filter, a film thickness of 1.0 μm) of a pattern in the shape of a 1.1 μm×1.1 μm island bayer were formed on a silicon substrate by lithography. Next, using the composition 102, pixels (pixels of a second infrared transmitting filter, a film thickness of 1.0 μm) of a pattern in the shape of a 1.1 μm×1.1 μm island bayer were formed on the silicon substrate having the pixels of the first near-infrared cut filter formed thereon by lithography. Next, using the composition 103, pixels (pixels of a third infrared transmitting filter, a film thickness of 1.0 μm) of a pattern in the shape of a 1.1 μm×1.1 μm island bayer were formed on the silicon substrate having the pixels of the first near-infrared cut filter and the pixels of the second near-infrared cut filter formed thereon by lithography, and thus, a filter shown in FIG. 3 was produced. In a filter of Example 32, in FIG. 3, the pixel 21 is a pixel of the first near-infrared cut filter, the pixel 22 is a pixel of the second near-infrared cut filter, and the pixel 23 is a pixel of the third near-infrared cut filter. The pixel of the first near-infrared cut filter, the pixel of the second near-infrared cut filter, and the pixel of the third near-infrared cut filter are each a pixel of the near-infrared cut filter that shields each different light at a wavelength in the infrared region. In addition, the height difference between the top surfaces of the respective pixels was 0.1 μm or less.

TABLE 6

|  | Example 20 | Example 21 | Example 22 | Example 23 | Example 24 | Example 25 | Example 26 |
|---|---|---|---|---|---|---|---|
| Composition 101 | Pixel 11, pixel 14 |  |  |  |  | Pixel 11, pixel 14 |  |
| Composition 102 | Pixel 12, pixel 13 | Pixel 12, pixel 13 | Pixel 12, pixel 13 | Pixel 12, pixel 13 | Pixel 12, pixel 13 |  |  |
| Composition 103 |  |  |  |  |  | Pixel 12, pixel 13 | Pixel 12, pixel 13 |
| Composition 104 |  | Pixel 11, pixel 14 |  |  |  |  | Pixel 11, pixel 14 |
| Composition 105 |  |  | Pixel 11, pixel 14 |  |  |  |  |
| Composition 106 |  |  |  | Pixel 11, pixel 14 |  |  |  |
| Composition 107 |  |  |  |  | Pixel 11, pixel 14 |  |  |

TABLE 7

|  | Example 27 | Example 28 | Example 29 | Example 30 | Example 31 | Example 32 |
|---|---|---|---|---|---|---|
| Composition 101 |  |  |  | Pixel 21 |  |  |
| Composition 102 |  |  |  | Pixel 22 | Pixel 22 | Pixel 22 |
| Composition 103 | Pixel 12, pixel 13 | Pixel 12, pixel 13 | Pixel 12, pixel 13 | Pixel 23 | Pixel 23 | Pixel 23 |
| Composition 104 |  |  |  |  | Pixel 21 |  |
| Composition 105 | Pixel 11, pixel 14 |  |  |  |  | Pixel 21 |
| Composition 106 |  | Pixel 11, pixel 14 |  |  |  |  |
| Composition 107 |  |  | Pixel 11, pixel 14 |  |  |  |

By incorporation of the filters of Examples 20 to 32 into solid-state imaging elements, the solid-state imaging elements could take an image having high sensitivity and high resolution with less noise by shielding light in the infrared wavelength range. In addition, ambient light with less noise could be detected.

Example 40

With reference to the description in paragraph No. 0375 of WO/2016/186050A, using the compositions described in the following table, the respective pixels were formed in lithography, and thus, filters described in FIGS. 5 to 7 were produced. Specifically, using a mask suited for the pattern size of the respective pixels, patterns of the respective pixels were formed. In the cross-sectional views shown in FIGS. 6 and 7, the patterns were formed in the order from the layer present on the lower layer side. In Example 40, each of the pixels was formed on the silicon substrate. Further, the film thickness of the pixels 31 was 1.0 µm, the film thickness of the pixels 32 was 1.0 µm, the film thickness of the near-infrared cut layer 36 was 0.5 µm, and the film thickness of the colored layers 33 to 35 were each 0.5 µm. In addition, the height difference between the top surfaces of the respective pixels was 0.1 µm or less. These filters were incorporated into solid-state imaging elements, and thus, the solid-state imaging elements could take an image having high sensitivity and high resolution with less noise by shielding light in the infrared wavelength range, and simultaneously, it was possible to detect infrared light with high accuracy while not being affected by noise and the like caused by visible light. In addition, it was possible to detect ambient light with less noise.

TABLE 8

|  | Example 40 |
| --- | --- |
| Composition 101 | Pixel 31 |
| Composition 108 | Near-infrared cut layer 36 |
| Composition 201 | Pixel 32 |
| Composition 301 | Colored layer 33 |
| Composition 302 | Colored layer 34 |
| Composition 303 | Colored layer 35 |

Example 41

Using the composition 101, pixels (pixels of a near-infrared cut filter, a film thickness of 1.0 µm) of a pattern in the shape of a 1.1 µm×1.1 µm island bayer were formed on a silicon substrate by lithography. Next, using the composition 401, pixels (pixels of an ultraviolet cut filter, a film thickness of 1.0 µm) of a pattern in the shape of a 1.1 µm×1.1 µm island bayer were formed on the silicon substrate having the pixel of the near-infrared cut filter formed thereon by lithography, and thus, a filter shown in FIG. 1 was produced. In a filter of Example 1, in FIG. 1, the pixels 11 and 14 are each a pixel of the near-infrared cut filter, and the pixels 12 and 13 are each a pixel of the ultraviolet cut filter. In addition, the height difference between the top surfaces of the respective pixels was 0.1 µm or less. These filters were incorporated into solid-state imaging elements, and thus, the solid-state imaging elements could take an image having high sensitivity and high resolution with less noise by shielding light in a specific ultraviolet wavelength range. In addition, it was possible to detect ultraviolet rays with accuracy.

Example 42

Using the composition 101, pixels (pixels of a near-infrared cut filter, a film thickness of 1.0 µm) of a pattern in the shape of a 1.1 µm×1.1 µm island bayer were formed on a silicon substrate by lithography. Next, using the composition 402, a pixel (a transparent pixels, a film thickness of 1.0 µm) of a pattern in the shape of a 1.1 µm×1.1 µm island bayer were formed on the silicon substrate having the pixel of the near-infrared cut filter fainted thereon by lithography, and thus, a filter shown in FIG. 1 was produced. In a filter of Example 1, in FIG. 1, the pixels 11 and 14 are each a pixel of the near-infrared cut filter, and the pixels 12 and 13 are each a transparent pixel. In addition, the height difference between the top surfaces of the respective pixels was 0.1 µm or less. By incorporation of these filters into solid-state imaging elements, the solid-state imaging elements could take an image having high sensitivity and high resolution with less noise by shielding light in a specific infrared wavelength range.

TABLE 9

|  | Example 41 | Example 42 |
| --- | --- | --- |
| Composition 101 | Pixel 11, pixel 14 | Pixel 11, pixel 14 |
| Composition 401 | Pixel 12, pixel 13 |  |
| Composition 402 |  | Pixel 12, pixel 13 |

EXPLANATION OF REFERENCES 1a to 1c: filter
10: support
11: pixel of a near-infrared cut filter
12 to 14: pixels of a near-infrared cut filter or pixels other than the near-infrared cut filter
21 to 23: pixels of a near-infrared cut filter
31: pixel of the near-infrared cut filter
32: pixel of a near-infrared cut filter or pixel of an infrared transmitting filter
33 to 35: colored layers
36: near-infrared cut layer
101: solid-state imaging element
102: pixel of an infrared transmitting filter
103: pixel of a near-infrared cut filter
104a to 104c: colored pixels
105a to 105c: near-infrared cut layers
106a to 106c: colored layers
110: microlens

What is claimed is:
1. A filter comprising a plurality of different pixels two-dimensionally arranged therein,
wherein said plurality of different pixels includes pixels of a near-infrared cut filter that shield at least a part of light having a wavelength in the near-infrared region and transmit light having a wavelength in the visible region,
wherein said pixels of a near-infrared cut filter include a pixel of a first near-infrared cut filter, and a pixel of a second near-infrared cut filter that shields light at a wavelength in the near-infrared region different from that of the first near-infrared cut filter,
wherein a transmittance of the pixel of the first near-infrared cut filter and the pixel of the second near-infrared cut filter in the entirety of a wavelength range of 400 to 650 nm is 90% or more, wherein the plurality of different pixels includes a pixel other than the pixels of the near-infrared cut filter, and wherein the pixel other than the pixels of the near-infrared cut filter is at least one selected from a transparent pixel, a colored pixel, and a pixel of a layer that selectively transmits or shields light at a specific wavelength.

2. The filter according to claim 1,
wherein the pixels of the near-infrared cut filter have a maximum absorption wavelength in a wavelength range of 700 to 2,000 nm, and an absorbance Amax/absorbance A550 which is a ratio of the absorbance Amax at a maximum absorption wavelength to the absorbance A550 at a wavelength of 550 nm is 20 to 500.

3. The filter according to claim 1,
wherein a difference between the maximum absorption wavelength of the pixels of the first near-infrared cut filter and the maximum absorption wavelength of the pixels of the second near-infrared cut filter is 20 to 1,000 nm.

4. The filter according to claim 1,
wherein the pixel of a layer that selectively transmits or shields light at a specific wavelength is at least one pixel selected from a pixel of an infrared transmitting filter or a pixel of an ultraviolet cut filter.

5. The filter according to claim 1,
wherein the height difference between the top surfaces of the plurality of different pixels is 20% or less of the film thickness of the thickest pixel.

6. The filter according to claim 1,
wherein the height difference between the top surfaces of the plurality of different pixels is 10% or less of the film thickness of the thickest pixel.

7. The filter according to claim 1,
wherein the filter further comprises a pixel of an infrared transmitting filter, and a difference between the thicknesses of the pixels is 20% or less of the film thickness of the thickest pixel.

8. The filter according to claim 1,
wherein an average refractive index of light at a wavelength of 400 to 700 nm in the pixels of the near-infrared cut filter is 1.4 to 1.9.

9. The filter according to claim 1,
wherein the near-infrared cut filter includes a near-infrared absorbing dye, and the near-infrared absorbing dye is a compound having a π-conjugated plane including a monocyclic or fused aromatic ring.

10. The filter according to claim 9,
wherein the near-infrared absorbing dye is at least one selected from a pyrrolopyrrole compound, a cyanine compound, and a squarylium compound.

11. The filter according to claim 10,
wherein the near-infrared absorbing dye is a pyrrolopyrrole compound.

12. An optical sensor comprising:
the filter according to claim 1.

13. A solid-state imaging element comprising:
the filter according to claim 1.

14. An image display device comprising:
the filter according to claim 1.

15. The filter according to claim 1, wherein a transmittance of the pixel of the first near-infrared cut filter and the pixel of the second near-infrared cut filter are 20% or less at least one point in a wavelength range of 700 to 2,000 nm.

16. The filter according to claim 1, wherein an average refractive index of light at a wavelength of 400 to 700 nm in the pixels of the near-infrared cut filter is 1.6 to 1.7.

* * * * *